(12) United States Patent
Hatae et al.

(10) Patent No.: US 9,193,812 B2
(45) Date of Patent: Nov. 24, 2015

(54) POLYMER POWDER, CURABLE RESIN COMPOSITION AND CURED MATERIAL THEREOF

(71) Applicant: Mitsubishi Rayon Co., Ltd., Tokyo (JP)

(72) Inventors: Youko Hatae, Otake (JP); Toshihiro Kasai, Toyohashi (JP)

(73) Assignee: Mitsubishi Rayon Co., Ltd., Tokyo (JP)

(*) Notice: Subject to any disclaimer, the term of this patent is extended or adjusted under 35 U.S.C. 154(b) by 0 days.

(21) Appl. No.: 14/364,417

(22) PCT Filed: Dec. 21, 2012

(86) PCT No.: PCT/JP2012/083361
§ 371 (c)(1),
(2) Date: Jun. 11, 2014

(87) PCT Pub. No.: WO2013/094759
PCT Pub. Date: Jun. 27, 2013

(65) Prior Publication Data
US 2014/0350186 A1 Nov. 27, 2014

(30) Foreign Application Priority Data

Dec. 21, 2011 (JP) ................................. 2011-279344
Feb. 21, 2012 (JP) ................................. 2012-035161
Sep. 28, 2012 (JP) ................................. 2012-217760

(51) Int. Cl.
| | | |
|---|---|---|
| C08L 33/12 | (2006.01) | |
| C08L 63/00 | (2006.01) | |
| C08F 20/10 | (2006.01) | |
| C08F 20/14 | (2006.01) | |
| H01B 3/40 | (2006.01) | |
| H01B 3/44 | (2006.01) | |
| C08F 265/06 | (2006.01) | |
| C08L 51/00 | (2006.01) | |
| H01L 21/52 | (2006.01) | |
| H01L 23/00 | (2006.01) | |
| C09K 3/10 | (2006.01) | |
| C08L 51/06 | (2006.01) | |
| C08F 220/18 | (2006.01) | |
| C08J 3/12 | (2006.01) | |
| H01L 23/29 | (2006.01) | |
| H01L 33/56 | (2010.01) | |

(52) U.S. Cl.
CPC ............... *C08F 20/10* (2013.01); *C08F 220/18* (2013.01); *C08F 265/06* (2013.01); *C08L 33/12* (2013.01); *C08L 51/00* (2013.01); *C08L 51/06* (2013.01); *C08L 63/00* (2013.01); *C09K 3/1006* (2013.01); *H01B 3/40* (2013.01); *H01B 3/447* (2013.01); *H01L 21/52* (2013.01); *H01L 24/29* (2013.01); *H01L 23/29* (2013.01); *H01L 33/56* (2013.01); *H01L 2224/2919* (2013.01); *H01L 2224/2929* (2013.01); *H01L 2224/83191* (2013.01); *H01L 2924/12041* (2013.01)

(58) Field of Classification Search
CPC ................ C08F 6/14; C08F 20/14; C08J 3/12
USPC ........... 525/65, 119, 187, 221, 227, 309, 902; 526/318.44, 329.5, 909
See application file for complete search history.

(56) References Cited

U.S. PATENT DOCUMENTS

| | | | |
|---|---|---|---|
| 5,290,857 A | | 3/1994 | Ashida et al. |
| 5,441,994 A | * | 8/1995 | Moriga et al. ................. 523/201 |
| 6,172,135 B1 | | 1/2001 | Fraser et al. |
| 2001/0016612 A1 | | 8/2001 | Kasai |
| 2002/0165323 A1 | | 11/2002 | Kasai |
| 2011/0214717 A1 | | 9/2011 | Halahmi et al. |
| 2011/0294954 A1 | | 12/2011 | Fukutani et al. |
| 2012/0123023 A1 | | 5/2012 | Wakita et al. |

FOREIGN PATENT DOCUMENTS

| | | |
|---|---|---|
| CN | 102217093 A | 10/2011 |
| EP | 0745622 A1 | 12/1996 |
| EP | 2395032 A1 | 12/2011 |
| JP | H05-065391 A | 3/1993 |
| JP | H09-095599 A | 4/1997 |
| JP | H11-505871 A | 5/1999 |
| JP | 2006-233145 A | 9/2006 |
| JP | 2010-053199 A | 3/2010 |
| JP | 2011-208123 A | 10/2011 |
| JP | 2013-028813 A | 2/2013 |
| TW | 201035133 A1 | 10/2010 |

(Continued)

OTHER PUBLICATIONS

Almatex Acrylic Resins Product Brochure, 8 pages (Undated).*
International Search Report issued in corresponding International Patent Application No. PCT/JP2012/083362 dated Apr. 16, 2013.
Extended European Search Report issued by the European Patent Office dated Apr. 21, 2015 in the corresponding European Patent Application No. 12 86 0338.8.

(Continued)

*Primary Examiner* — Fred M Teskin
(74) *Attorney, Agent, or Firm* — Morgan, Lewis & Bockius LLP

(57) ABSTRACT

A polymer powder (P) selected from a group consisting of (i) a polymer powder (P1) and (ii) a polymer powder (P2) is provided. The (i) polymer powder (P1) includes a (meth)acrylate-based polymer (A1) having a glass transition temperature of 0° C. or less, and the polymer powder has an acetone-soluble component of 5 mass % or more. The acetone-soluble component has a mass average molecular weight of 100,000 or more. The (ii) polymer powder (P2) has an acetone-soluble component of 2 mass % to 35 mass %, the acetone-soluble component has a mass average molecular weight of 100,000 or more, and has a volume average primary particle size (Dv) of 200 nm or more.

12 Claims, No Drawings

(56) References Cited

FOREIGN PATENT DOCUMENTS

| WO | 00/01748 A1 | 1/2000 |
| WO | 2010/090246 A1 | 8/2010 |
| WO | 2010/104055 A1 | 9/2010 |

OTHER PUBLICATIONS

Office Action issued on May 21, 2015 in corresponding Chinese Patent Application No. 201280063503.2.
Office Action issued on Jul. 20, 2015 in corresponding Taiwan Patent Application No. 101149157.

* cited by examiner

POLYMER POWDER, CURABLE RESIN COMPOSITION AND CURED MATERIAL THEREOF

BACKGROUND OF THE INVENTION

1. Field of the Invention

The present invention relates to a polymer powder, a curable resin composition including the polymer powder and a cured material thereof

2. Description of Related Art

Following the progresses in the information technology (IT) related equipments, including mobile equipments, digital household appliances, telecommunication equipments and automobile electronic equipments, the resin raw materials used in the field of electronics attract much attentions. The needs for the thermosetting resins such as epoxy resins, polyimide resins, acrylic series curable resins and oxetane series curable resins with excellent heat resistance and insulating property, or the active energy ray curable resins are drastically increased.

For a luminant device such as an optical semiconductor in practical applications such as display panels, light sources for image reading, and traffic display units, the majority was manufactured by sealing with resins. As the sealing resins, the epoxy resins were extensively used owing to their excellent mechanical properties, electrical insulation and adhesive properties. Among them, the alicyclic epoxy resins were mostly used as the sealing resins for the optical semiconductors due to their excellent transparency and heat resistance.

Especially, the epoxy resins that are in the liquid form at the ambient temperature may be used as materials for a variety of pastes or films, because they can be molded or coated at the ambient temperature. However, for the epoxy resin composition, due to high dependence of its viscosity on temperature, its viscosity significantly drops with temperature elevation until being cured. Hence, precise processing, such as precise filling or coating by dispensers, formation of precise pattern by screen printing, and coating on the film with high precision of film thickness, becomes difficult. Especially in the field of electronic materials, the requirements of precision for the processing are increased year by year, and for the epoxy resin compositions used, it is highly demanded that the viscosity does not drop even when the temperature is elevated, or the shape becomes stabilized as early as possible.

The method for imparting the aforesaid characteristics to the epoxy resin compositions includes: formulating specific vinyl polymers, as the gel-forming agent (hereinafter as "pre-gelling agent"), in the epoxy resin composition for turning the epoxy resin composition into a gel state rapidly by heating.

In Patent document 1, a method of using the specific vinyl polymer as the pre-gelling agent is proposed.

On the other hand, for the alicyclic epoxy resins, despite their high transparency and heat resistance, these resins has the following characteristics, i.e., the epoxy resin cured materials obtained from curing are poor in crack resistance (for example, they often have crack damages caused by cold-heat cycles), so that they are ineligible for applications requiring reliability over a long period. In terms of the generation of cracks, it is believed that it is primarily caused by difference of the linear expansion coefficients between the epoxy resin cured materials and the inorganic material as well as the elastic modulus of the epoxy resin cured material, and the generation of cracks may be prevented by increasing the glass transition temperature and reducing the linear expansion coefficients and the elastic modulus of the epoxy resin cured materials. In Patent documents 2~4, a method of formulating acrylic series rubber particles is disclosed, as one method for reducing the elastic modulus of the epoxy resin cured materials.

Furthermore, in Patent document 5, disclosed is a method of formulating specific (meth)acrylate-based polymers in the epoxy resin composition to improve impact resistance, adhesive and gelling properties.

PRIOR-ART DOCUMENT

Patent Document

[Patent document 1] International Publication No. WO2010/090246
[Patent document 2] Japanese Patent Laid-Open Gazette No. 2010-53199
[Patent document 3] International Publication No. WO2010/104055
[Patent document 4] Japanese Patent Laid-Open Gazette No. 2006-233145
[Patent document 5] Japanese Patent Laid-Open Gazette No. 5-65391

Although the method provided in Patent document 1 may impart the gelling property to the epoxy resin composition, it has a tendency to cause the glass transition temperature of the epoxy resin cured material formulated with the pre-gelling agent to drop, thus not suitable for applications requiring high heat resistance. Moreover, transparency is not discussed in Patent document 1 at all.

On the other hand, although the methods provided in Patent documents 2~4 improve the crack resistance of the epoxy resin cured material, the viscosity of the epoxy resin composition significantly drops with temperature elevation until being cured, resulting in difficulties in high-precision coating or patterning.

Although the method provided in Patent document 5 has effects in the gelling property of the epoxy resin composition and low elastic modulus of the cured materials, it is unable to achieve the gelation within a very short period of time (or high gelling property) required for high precision processing, which is not satisfactory.

Moreover, due to the low glass transition temperature of the acrylic series rubber particles, if formulating large amount of the acrylic series rubber particles in the epoxy resin composition, the glass transition temperature of the epoxy resin cured materials may sometimes be lowered, not suitable for applications requiring high heat resistance. In addition, the contents of the ionic impurities are not considered and in case of being formulated therein, the decline in the electrical properties of the epoxy resin cured materials becomes worrying.

So far, no one has proposed a material imparting the gelling property to the epoxy resin composition and meeting the requirements in transparency and heat resistance for the epoxy resin cured materials.

SUMMARY OF THE INVENTION

Accordingly, the present invention is directed to a polymer powder, a curable resin composition including the powder and cured materials thereof, wherein by heating at a given temperature for a short time, the polymer powders enable the curable resin composition to turn into the gel state rapidly, thus reducing the elastic modulus of the resulted cured materials.

Further, an additional object of the present invention is to provide a polymer powder, a curable resin composition including the powder and cured materials thereof, wherein the aforementioned powder has excellent dispersibility within the curable resin composition, and by heating at a given temperature for a short time, the polymer powders make the curable resin composition turn into the gel state rapidly, without compromising the transparency and heat resistance of the obtained curable resin cured materials, thus being useful as the pre-gelling agent for the optical semiconductor materials.

The above issues are solved by providing the polymer powder (P) selected from a group consisting of (i) a polymer powder (P1) and (ii) a polymer powder (P2), wherein the (i) polymer powder (P1) includes a (meth)acrylate-based polymer (A1) having a glass transition temperature of 0° C. or less and the polymer powder has an acetone-soluble component of 5 mass % or more, the acetone-soluble component has a mass average molecular weight of 100,000 or more; and the (ii) polymer powder (P2) has an acetone-soluble component of 2 mass % or more and 35 mass % or less, the acetone-soluble component has a mass average molecular weight of 100,000 or more, and the (ii) polymer powder (P2) has a volume average primary particle size (Dv) of 200 nm or more.

That is to say, the following articles are provided by the present invention:

[1] A polymer powder (P) selected from a group consisting of (i) a polymer powder (P1) and (ii) a polymer powder (P2), wherein the (i) polymer powder (P1) includes a (meth)acrylate-based polymer (A1) having a glass transition temperature of 0° C. or less and the polymer powder has an acetone-soluble component of 5 mass % or more, the acetone-soluble component has a mass average molecular weight of 100,000 or more; and the (ii) polymer powder (P2) has an acetone-soluble component of 2 mass % to 35 mass %, the acetone-soluble component has a mass average molecular weight of 100,000 or more, and the (ii) polymer powder (P2) has a volume average primary particle size (Dv) of 200 nm or more.

[2] The polymer powder (P) according to [1], wherein the polymer powder (P) is the (i) polymer powder (P1), the (i) polymer powder (P1) includes the (meth)acrylate-based polymer (A1) having the glass transition temperature of 0° C. or less and the polymer powder has the acetone-soluble component of 5 mass % or more, and the acetone-soluble component has the mass average molecular weight of 100,000 or more.

[3] The polymer powder (P) according to [2], further including a polymer (B1) having a glass transition temperature of more than 0° C.

[4] The polymer powder (P) according to [3], wherein the polymer (B1) is a (meth)acrylate-based polymer.

[5] The polymer powder (P) according to [3] or [4], wherein a content of the (meth)acrylate-based polymer (A1) having the glass transition temperature of 0° C. or less is 30 mass % to 90 mass %, and a content of the polymer (B1) is 70 mass % to 10 mass % (100 mass % in total).

[6] The polymer powder (P) according to any one in [2] to [5], wherein the polymer powder (P1) has a volume average primary particle size (Dv) of 200 nm or more.

[7] The polymer powder (P) according to any one in [2] to [6], wherein the (meth)acrylate-based polymer (A1) having the glass transition temperature of 0° C. or less includes 2-ethylhexyl acrylate units of 50 mass % or more.

[8] The polymer powder (P) according to any one in [2] to [7], wherein a content of alkali metal ions is 10 ppm or less.

[9] The polymer powder (P) according to any one in [2] to [8], wherein particles with particle sizes of 10 μm or less take a proportion of less than 30 vol % and have the following disintegration properties:

(Disintegration Properties)
(1) diluting the polymer powder (P) with ion exchanged water;
(2) performing supersonic irradiation at a frequency of 42 kHz and a power of 40 W for 5 minutes;
(3) determining particle size distribution through particle size distribution measurement by laser diffractive/scattering; and
(4) the particles with the particle sizes of 10 μm or less take a proportion of 30 vol % or more.

[10] The polymer powder (P) according to any one in [2] to [9], wherein the polymer powder (P) is a (meth)acrylate-based polymer powder obtained by polymerizing a monomer mixture (b1) in presence of the (meth)acrylate-based polymer (A1) and powderizing; and the (meth)acrylate-based polymer (A1) has the glass transition temperature of 0° C. or less, and the (meth)acrylate-based polymer powder has an acetone-soluble component of 5 mass % or more, and the acetone-soluble component has the mass average molecular weight of 100,000 or more.

[11] A stress relaxation agent and pre-gelling agent used for a curable resin, including the polymer powder (P) according to any one in [2] to [10].

[12] The stress relaxation agent and pre-gelling agent according to [11], wherein the curable resin composition is obtained by adding 20 parts by mass of the polymer powder (P) relative to 100 parts by mass of the curable resin, and a ratio (G'B/G'A) of storage elastic modulus G'A at a gelling temperature of −20° C. to storage elastic modulus G'B at a gelling temperature of +20° C. for the curable resin composition is 10 or more.

[13] A curable resin composition including the polymer powder (P) according to any one in [2] to [10] and a curable resin.

[14] The curable resin composition according to [13], wherein the curable resin is an epoxy resin.

[15] The curable resin composition according to [13], including 5 parts by mass or more of the polymer powder (P) relative to 100 parts by mass of the curable resin.

[16] A cured material obtained by curing the curable resin composition according to any one in [13] to [15].

[17] A sealing material for semiconductors, using the curable resin composition according to any one in [13] to [15].

[18] A sheet article, using the curable resin composition according to any one in [13] to [15].

[19] A sealing agent for liquid crystal display devices, using the curable resin composition according to any one in [13] to [15].

[20] The polymer powder (P) according to [1], wherein the polymer powder (P) is the polymer powder (P2), the polymer powder (P2) has the acetone-soluble component of 2 mass % or more and 35 mass % or less, the acetone-soluble component has the mass average molecular weight of 100,000 or more, and the polymer powder (P2) has the volume average primary particle size (Dv) of 200 nm or more.

[21] The polymer powder (P) according to [20], wherein the polymer powder (P2) has the acetone-soluble component of less than 30 mass %.

[22] The polymer powder (P) according to [20], wherein the polymer powder (P2) has an acetone-soluble component of 25 mass % or less.

[23] The polymer powder (P) according to any one in [20] to [22], wherein the polymer powder (P2) has a refractivity of 1.48-1.51 at 20° C.

[24] The polymer powder (P) according to any one in [20] to [23], wherein the polymer powder (P2) has the glass transition temperature of 0° C. or more.

[25] The polymer powder (P) according to any one in [20] to [24], wherein the polymer powder (P2) is a methyl methacrylate-based polymer powder obtained by powderizing a vinyl polymer, and the vinyl polymer is obtained by polymerizing the monomer raw materials (a2) including 70 mass % to 99 mass % of methyl methacrylate and 30 mass % to 1 mass % of a monomer raw material other than methyl methacrylate.

[26] The polymer powder (P) according to [25], wherein the monomer raw material other than methyl methacrylate includes at least one functional group containing monomer selected from a vinyl monomer containing carboxyl, a vinyl monomer containing hydroxyl and a vinyl monomer containing glycidyl.

[27] The polymer powder (P) according to [26], wherein the monomer raw material other than methyl methacrylate includes 2 mass % or more of at least one functional group containing monomer selected from a vinyl monomer containing carboxyl, a vinyl monomer containing hydroxyl and a vinyl monomer containing glycidyl.

[28] The polymer powder (P) according to any one in [20] to [27], wherein a content of alkali metal ions is 10 ppm or less.

[29] The polymer powder (P) according to any one in [20] to [28], wherein particles with particle sizes of 10 μm or less take a proportion of less than 30 vol %, and have the following disintegration properties:

(Disintegration Properties)
(1) diluting the polymer powder (P) with ion exchanged water;
(2) performing supersonic irradiation at a frequency of 42 kHz and a power of 40 W for 3 minutes;
(3) determining particle size distribution through particle size distribution measurement by laser diffractive/scattering; and
(4) the particles with the particle sizes of 10 μm or less take a proportion of 30 vol % or more.

[30] A pre-gelling agent used for a curable resin, including the polymer powder (P) according to any one in [20] to [29].

[31] The pre-gelling agent used for the curable resin according to [30], wherein the curable resin composition is obtained by adding 20 parts by mass of the polymer powder (P) relative to 100 parts by mass of the curable resin, and a ratio (G'B/G'A) of storage elastic modulus G'A at a gelling temperature of −20° C. to storage elastic modulus G'B at a gelling temperature of +20° C. for the curable resin composition is 100 or more.

[32] A curable resin composition including the polymer powder (P) according to any one in [20] to [29] and a curable resin.

[33] The curable resin composition according to [32], wherein the curable resin is an epoxy resin.

[34] The curable resin composition according to [33], wherein the epoxy resin is an alicyclic epoxy resin.

[35] The curable resin composition according to any one in [32] to [34], wherein a cured material having a thickness of 3 mm, obtained by curing the curable resin composition including the polymer powder (P) and the curable resin, has a total light transmittance of 70% or more at 23° C.

[36] A cured material obtained by curing the curable resin composition according to any one in [32] to [35].

[37] A sealing material used for optical semiconductors, using the curable resin composition according to any one in [32] to [35].

Effects of the Invention

In the present invention, by heating at a given temperature for short time, the polymer powders enable the curable resin composition to rapidly turn into the gel state. The cured material obtained by curing the curable resin composition according to the present invention has low elastic modulus. Therefore, the curable resin composition and cured materials thereof according to the present invention are useful as the sealing material for semiconductors.

In addition, by heating at a given temperature for short time, the polymer powders of the present invention enable the curable resin composition to rapidly turn into the gel state. The cured material obtained by curing the curable resin composition according to the present invention will not compromise transparency thereof. Furthermore, the cured material according to the present invention has excellent heat resistance. Therefore, the curable resin composition and cured materials thereof according to the present invention are useful as sealing materials for the optical semiconducting materials or optical semiconductors, which require transparency and heat resistance.

DESCRIPTION OF THE EMBODIMENTS

Hereinafter, the present invention will be described in detail.

The polymer powder (P) according to the present invention is selected from a group consisting of (i) polymer powder (P1) and (ii) polymer powder (P2).

The (i) polymer powder (P1) includes the (meth)acrylate-based polymer (A1) having the glass transition temperature of 0° C. or less, and has the acetone-soluble component of 5 mass % or more, and the acetone-soluble component has the mass average molecular weight of 100,000 or more.

The (ii) polymer powder (P2) has the acetone-soluble component of 2 mass % to 35 mass %, the acetone-soluble component has the mass average molecular weight of 100,000 or more, and the polymer powder (P2) has the volume average primary particle size (Dv) of 200 nm or more.

(i) Polymer Powder (P1)

The polymer powder (P1) according to the present invention includes the (meth)acrylate-based polymer (A1) having the glass transition temperature of 0° C. or less, and has the acetone-soluble component of 5 mass % or more, and the acetone-soluble component has the mass average molecular weight of 100,000 or more. In addition, in the specification, (meth)acrylate group refers to acrylate group or methacrylate group.

<(Meth)Acrylate-Based Polymer (A1) Having Glass Transition Temperature of 0° C. or Less>

In the present invention, the (meth)acrylate-based polymer (A1) is one obtained by polymerizing the monomer mixture (a1) including the (meth)acrylate monomer (a11), and having the glass transition temperature (Tg) of 0° C. or less, as found by Fox formula.

Tg of the (meth)acrylate-based polymer (A1) may be found by the Fox formula from the Tg value of the homopolymer. The Fox formula is given as follows:

$$1/(273+Tg) = \Sigma(wi/(273+Tg_i))$$

wherein, Tg is Tg of the copolymer (° C.), wi is a mass fraction of the monomer i, and $Tg_i$ is Tg (° C.) of the homopolymer from the polymerization of the monomer i.

Herein, Tg value of the homopolymer refers to one recorded in the POLYMER HANDBOOK THIRD EDITION published by WILEY INTERSCIENCE.

In addition, in case of the monomer mixture (a1) including a crosslinking monomer (a13) and/or a grafting agent (a14), Tg of the monomers other than the crosslinking monomer and the grafting agent is found.

In case of Tg of the (meth)acrylate-based polymer (A1) being 0° C. or less as found by the Fox formula, the cured material obtained by curing the curable resin composition has a reduced elastic modulus. Tg of the (meth)acrylate-based polymer (A1) as found by the Fox formula is preferably below −20° C.

The polymer (A1) having Tg of 0° C. or less as found by the Fox formula is obtained, for example by polymerizing the monomer mixture (a1) including 50 mass % or more of the (meth)acrylate monomer (a11) with Tg of 0° C. or less for its homopolymer.

The (meth)acrylate monomer (a11) with Tg of 0° C. or less for its homopolymer is exemplified by ethyl acrylate (Tg for its homopolymer: −24° C.), n-propyl acrylate (Tg for its homopolymer: −37° C.), n-butyl acrylate (Tg for its homopolymer: −54° C.), isobutyl acrylate (Tg for its homopolymer: −49° C.), 2-ethylhexyl acrylate (Tg for its homopolymer: −50° C.). Of these, in terms of excellence in low elastic modulus of cured materials, 2-ethylhexyl acrylate (Tg for its homopolymer: −50° C.) is preferred. In the monomer mixture (a1), 2-ethylhexyl acrylate is preferably included at 50 mass % or more. These monomers (a11) may be used alone or in combination of two or more therein.

Optionally, the monomer mixture (a1) may also include an additional monomer (a12) other than the (meth)acrylate monomer (a11), in the range such that Tg of the (meth) acrylate-based polymer (A1), as found by the Fox formula, is 0° C. or less.

The additional monomer (a12) may be exemplified by aromatic vinyl monomers such as styrene, α-methylstyrene and alkyl-substituted styrene; (meth)acrylate monomers other than (a11), such as methyl(meth)acrylate, ethyl methacrylate, n-propyl methacrylate and n-butyl methylacrylate; vinyl cyanide monomers, such as acrylonitrile and methacrylonitrile; glycidyl group-containing vinyl monomers, such as glycidyl (meth)acrylate; hydroxyl group-containing vinyl monomers, such as 2-hydroxyethyl(meth)acrylate; and (meth)acrylate-modified silicone. These monomers (a12) may be used alone or in combination of two or more therein.

The monomer mixture (a1) (100 mass %) includes the additional monomer (a12), preferably in the range of 0 mass % to 20 mass %. In case of the monomer mixture (a1) (100 mass %) including the additional monomer (a12) of less than 20 mass %, the cured materials obtained by curing the curable resin composition have a reduced elastic modulus.

Optionally, the monomer mixture (a1) may also include the crosslinking monomer (a13) and/or grafting agent (a14).

The crosslinking monomer (a13) may be exemplified by ethylene glycol di(meth)acrylate, propylene glycol di(meth) acrylate, 1,3-butanediol di(meth)acrylate, 1,4-butanediol di(meth)acrylate, divinylbenzene, multi-functional (meth) acrylate-modified silicone.

The grafting agent (a14) may be exemplified by allyl(meth) acrylate, triallyl cyanurate and triallyl isocyanurate. In addition, allyl(meth)acrylate may also be used as the crosslinking monomer (a13).

These crosslinking monomer (a13) and/or grafting agent (a14) may be used alone or in a combination of two or more. By using these crosslinking monomer (a13) and/or grafting agent (a14), the (meth)acrylate-based polymer (A1) having the cross-linked structure is available.

The monomer mixture (a1) (100 mass %) includes the crosslinking monomer (a13) and/or grafting agent (a14), preferably in the range of 0.001 mass % to 15 mass %, and more preferably in the range of 0.01 mass % to 5 mass %, in total. In case of the monomer mixture (a1) (100 mass %) including the crosslinking monomer (a13) and/or grafting agent (a14) of less than 15 mass %, the resulted cured material has a reduced elastic modulus.

It may also be used in a combination of two or more, for the (meth)acrylate-based polymer (A1).

(Polymerization Method)

The methods for polymerizing the monomer mixture (a1) are not particularly limited, so long as the polymer in the form of particles is available. The preferred polymerization method is to provide the spheric particles, for example, emulsion polymerization, soap-free emulsion polymerization, dispersion polymerization, swelling polymerization, miniemulsion polymerization and fine suspension polymerization. Of these, in terms of the polymers having excellent dispersity in the curable resin and having particle size corresponding to fine pitch, the emulsion polymerization and the fine suspension polymerization are preferred.

(Polymerization Auxiliaries)

For the polymerization of the monomer mixture (a1), the polymerization initiator, emulsifying agent, dispersion stabilizer and chain transfer agent may be used.

(Polymerization Initiator)

Well-known polymerization initiators may be used for the polymerization of the monomer mixture (a1). The polymerization initiator free of metal ions is preferred, because there is no residual metal ion(s) when powderizing the (meth) acrylate-based polymer.

The polymerization initiator free of metal ions may be exemplified by azo compounds such as 2,2'-azodiisobutyronitrile, 4,4'-azodi-(4-cyanopentoic acid), and 2,2'-azodi-[N-(2-carboxylethyl)-2-methylpropionamidine]; persulfate compounds such as ammonium persulfate; organic peroxides such as dicumyl hydroperoxide, p-menthane hydroperoxide, cumyl hydroperoxide, and t-butyl hydroperoxide; and the redox-based initiators with the persulfate compounds or the organic peroxides as one component. These polymerization initiators may be used alone or in a combination of two or more. Of these, ammonium persulfate, 2,2'-azodiisobutyronitrile, 4,4'-azodi-(4-cyanopentoic acid) and 2,2'-azodi-[N-(2-carboxylethyl)-2-methylpropionamidine] are preferred.

The polymerization temperature may be, for example, in the range of 40° C. to 90° C., also depending on the type of the polymerization initiators.

(Emulsifying Agent)

Well-known emulsifying agents may be used for the polymerization of the monomer mixture (a1), for example, alkali salts or ammonium salts of higher fatty acid such as disproportionated rosin acid, oleic acid and stearic acid; alkali salts or ammonium salts of sulfonic acid such as dodecylbenzene sulfonic acid; and non-ionic emulsifying agents.

Of these, in terms of the polymer powder (P1) free of metal ion residue, the ammonium type anionic emulsifying agents and non-ionic emulsifying agents free of metal ions are preferred.

In terms of excellent stability in emulsion polymerization, ammonium lauryl sulfate and ammonium di-(2-ethylhexyl) succinate are preferred as the ammonium type anionic emulsifying agent. In terms of excellent stability in emulsion polymerization, polyoxyethylene (85) monotetradecyl ether and polyoxyethylene distyrenated phenyl ether are preferred as the non-ionic emulsifying agent.

(Dispersion Stabilizer)

The dispersion stabilizer for the polymerization of the monomer mixture (a1) is exemplified by water-insoluble inorganic salts such as calcium phosphate, calcium carbonate, aluminum hydroxide and starch-based silica; non-ionic high-molecular compounds such as polyvinyl alcohol, polyethylene oxide and cellulose derivative; and anionic high-molecular compounds such as polyacrylic acid or salt thereof, polymethacrylic acid or salt thereof, and copolymer of methacrylate and methacrylic acid or salt thereof. Of these, in terms of excellent electric properties, the non-ionic high-molecular compounds are preferred. In addition, in terms of both electric properties and polymerization stability, the dispersion stabilizers may be used in a combination of two or more, depending on the purposes.

(Chain Transfer Agent)

For the polymerization of the monomer mixture (a1), optionally the chain transfer agents such as tert-dodecylthiol, n-octylthiol and α-methylstyrene, may also be used.

The (meth)acrylate-based polymer (A1) according to the present invention may have a monolayer or multilayer structure of two layers or more. In addition, the (meth)acrylate-based polymer (A1) may also be used in a combination of two or more.

(Monomer Mixture (b1))

In the present invention, the polymer powder (P1) may include the polymer (B1) other than the (meth)acrylate-based polymer (A1) having the glass transition temperature of 0° C. or less.

In the present invention, the polymer (B1) is obtained by polymerizing the monomer mixture (b1), and the monomer mixture (b1) includes a vinyl monomer (b11) that is capable of free radical polymerization. In the present invention, the polymer (B) is preferably one having Tg of more than 0° C. as given by the Fox formula. In addition, in case of the monomer mixture (b1) including the crosslinking monomer (b12), Tg of the monomers other than the crosslinking monomer is given. The polymer (B1) having Tg of more than 0° C. as given by the Fox formula may be obtained by polymerizing the monomer mixture (b1) comprising 50 mass % or more of a monomer which shows a Tg of more than 0° C. when the monomer is formulated into a homopolymer.

The vinyl monomer (b11) that is capable of free radical polymerization, is exemplified by: (meth)acrylate monomers such as methyl(meth)acrylate, ethyl(meth)acrylate, n-propyl(meth)acrylate, isopropyl(meth)acrylate, n-butyl(meth)acrylate, t-butyl(meth)acrylate, isobutyl(meth)acrylate, n-hexyl(meth)acrylate, n-octyl(meth)acrylate, t-butyl cyclohexyl(meth)acrylate, isobornyl(meth)acrylate, dicyclopentadiene(meth)acrylate, N,N-dimethylaminoethyl(meth)acrylate, and N-methyl-2,2,6,6-tetramethylpiperidyl(meth)acrylate; vinyl cyanide monomers such as (methyl) acrylonitrile; aromatic vinyl monomers such as styrene, α-methylstyrene, vinyltoluene; carboxyl group-containing vinyl monomers such as acrylic acid, methacrylic acid, butenoic acid, maleic acid, itaconic acid, fumaric acid, isocrotonic acid, salicylic acid, vinyloxyacetic acid, allyloxyacetic acid, 2-(meth)acryloyl-propanoic acid, 3-(meth)acryloylbutyric acid, and 4-vinylbenzoic acid; hydroxyl group-containing vinyl monomers such as hydroxymethyl(meth)acrylate, 2-hydroxyethyl(meth)acrylate, 2-hydroxylpropyl(meth)acrylate, 2-hydroxylbutyl(meth)acrylate and 4-hydroxylbutyl(meth)acrylate; glycidyl group-containing vinyl monomers such as glycidyl(meth)acrylate; (meth)acrylamide; vinyl monomers such as vinyl pyridine, vinyl alcohol, vinyl imidazole, vinyl pyrrolidone, vinyl acetate and 1-vinyl imidazole; itaconates such as monomethyl itaconate, monoethyl itaconate, monopropyl itaconate, monobutyl itaconate, dimethyl itaconate, diethyl itaconate, dipropyl itaconate and dibutyl itaconate; fumarates such as monomethyl fumarate, monoethyl fumarate, monopropyl fumarate, monobutyl fumarate, dimethyl fumarate, diethyl fumarate, dipropyl fumarate and dibutyl fumarate; and maleates such as monomethyl maleate, monoethyl maleate, monopropyl maleate, monobutyl maleate, dimethyl maleate, diethyl maleate, dipropyl maleate and dibutyl maleate. These monomers (b11) may be used alone or in combination of two or more therein. Of these, in terms of easy free radical polymerization and easy emulsion polymerization, (meth)acrylate is preferred.

Optionally, the monomer mixture (b1) may also include the crosslinking monomer (b12).

The crosslinking monomer (b12) may be exemplified by ethylene glycol di(meth)acrylate, propylene glycol di(meth)acrylate, 1,3-butanediol di(meth)acrylate, 1,4-butanediol di(meth)acrylate, divinylbenzene, multi-functional (meth)acryloyl-modified silicone, and allyl(meth)acrylate. These crosslinking monomers (b12) may be used alone or in combination of two or more therein.

The monomer mixture (b1) (100 mass %) includes the crosslinking monomer (b12), preferably in the range of 0.001 mass % to 15 mass %, and more preferably in the range of 0.01 mass % to 5 mass %. In case of the monomer mixture (b1) (100 mass %) including the crosslinking monomer (b12) of less than 15 mass %, it has excellent effects in imparting the gelling property.

In the present invention, the polymer (B1) may have a monolayer or multilayer structure of two layers or more.

(Polymerization Method)

The methods for polymerizing the monomer mixture (b1) are not particularly limited, so long as the polymer in the form of particles is available; the preferred polymerization method is to provide the spheric particles, for example, emulsion polymerization, soap-free emulsion polymerization, dispersion polymerization, swelling polymerization, miniemulsion polymerization and fine suspension polymerization. Of these, in terms of the polymers having excellent dispersity in the curable resin and having particle size corresponding to fine pitch, the soap-free emulsion polymerization and the fine suspension polymerization are preferred. In case of the polymer being in the form of spheric particles, an increase in viscosity of the curable resin composition is inhibited during formulation of the polymer powder (P1) into the curable resin, leading to the curable resin composition having excellent mobility.

(Polymerization Auxiliaries)

For the polymerization of the monomer mixture (b1), the polymerization initiator, emulsifying agent, dispersion stabilizer and chain transfer agent may be used.

(Polymerization Initiator)

The polymerization initiator for the polymerization of the monomer mixture (b1) may be the same as that for the monomer mixture (a1).

(Emulsifying Agent)

The emulsifying agent for the polymerization of the monomer mixture (b1) may be the same as that for the monomer mixture (a1).

(Dispersion Stabilizer)

The dispersion stabilizer for the polymerization of the monomer mixture (b1) may be the same as that for the monomer mixture (a1).

(Chain Transfer Agent)

For the polymerization of the monomer mixture (b1), optionally the chain transfer agents such as tert-dodecylthiol, n-octylthiol and α-methylstyrene, may also be used.

<Polymer Powder (P1)>

(Ratio for Composition)

On a basis of 100 mass % of the polymer powder (P1) in total (the (meth)acrylate-based polymer (A1) plus the polymer (B1)), 30 mass % to 90 mass % is preferred for the (meth)acrylate-based polymer (A1) and 70 mass % to 10 mass % is preferred for the polymer (B1).

In case of the content of the (meth)acrylate-based polymer (A1) in total of the polymers (100 mass %) being 30 mass % or more, the cured material obtained by curing the curable resin composition has low elastic modulus; in case of being 90 mass % or less, thickening over time is inhibited during formulation of the graft copolymer into the resin.

In case of the content of the polymer (B1) in total of the polymers (100 mass %) being 10 mass % or more, thickening over time is inhibited during formulation of the polymer powder (P1) in the curable resin, leading to excellent effects in imparting the gelling property. In addition, in case of the content of the polymer (B1) being 70 mass % or less, the cured material obtained by curing the curable resin composition is excellent in low elastic modulus.

(Powder Recovery)

In the present invention, well-known powderizing methods are used for powderizing the polymer emulsion, such as spray drying, freeze drying and freezing. Of these, in terms of excellent dispersity of the polymer powder (P1) in the curable resin, spray drying is preferred.

The spray-drying process includes spraying of the emulsion in droplet and drying it by hot air. The method for producing the droplets is exemplified by rotating disc, pressurizing nozzle, two-fluid nozzle, pressurizing two-fluid nozzle. Without particular limitation, the capacity for the drying apparatus may be in the small scale as used in the laboratory to the large scale as used in industry. Without particular limitation, where an inlet for supply of hot air for drying in the drying apparatus and an outlet of hot air for drying and of the dried powder are located may be the same as that in the commonly used spray drying apparatus. In terms of excellent dispersity of the polymer powder (P1) in the resulted curable resin composition, the temperature of hot air introduced into the apparatus (inlet temperature), i.e. the top temperature of hot air contacting the polymer, is preferably 100-200° C., and more preferably 120-180° C.

The polymer emulsions may be used alone or in a combination of several emulsions, for spray drying. In addition, in order to improve such powder properties as blocking and bulk density during spray drying, the inorganic filling agents such as silica, talc and calcium carbonate, and polyacrylate, polyvinyl alcohol and polyacrylamide may also be added. In addition, optionally the antioxidant or additives may also be added for spray drying.

(Acetone-Soluble Component of 10 Mass % or More)

In the present invention, the polymer powder (P1) has the acetone-soluble component of 5 mass % or more. In case of the polymer powder having the acetone-soluble component of 5 mass % or more, it imparts sufficient gelling property to the curable resin composition, so as to inhibit flowing of the curable resin even at high temperatures.

For imparting high gelling property even in case of very low viscosity of the curable resin, the acetone-soluble component in the polymer powder (P1) is preferably 10 mass % or more, and more preferably 15 mass % or more. Especially in case of utilization at low viscosity, it is required that high gelling property be imparted with a small addition amount and therefore the more the acetone-soluble component, the more extensive the utilization.

In terms of excellent storage stability of the resulted curable resin composition, the acetone-soluble component in the polymer powder (P1) is preferably 50 mass % or less, more preferably 40 mass % or less, and even more preferably 30 mass % or less.

In addition, in the present invention, the acetone-soluble component refers to one obtained by the method for measurement of the acetone-soluble component hereinafter.

The acetone-soluble component may be appropriately set by adjustment of the content of the crosslinking monomer (a13) and grafting agent (a14) in the monomer mixture (a1), the composition ratio of the (meth)acrylate-based polymer (A1) to the polymer (B1), and the content of the crosslinking monomer (b12) in the monomer mixture (b1).

In order to increase the acetone-soluble component, it is preferred to reduce the content of the crosslinking monomer (a13) and grafting agent (a14) in the monomer mixture (a1), or increase the content of the polymer (B1) in the whole polymers, or reduce the content of the crosslinking monomer (b12) in the monomer mixture (b1).

(Acetone-Soluble Component Having Mass Average Molecular Weight of 100,000 or More)

In the present invention, the acetone-soluble component in the polymer powder (P1) has the mass average molecular weight of 100,000 or more. If the acetone-soluble component in the polymer powder (P1) has the mass average molecular weight of 100,000 or more, high gelling property may be imparted with a small addition amount, and flowing of the curable resin is inhibited even at high temperature. In terms of no decline in solubility in the curable resin and achieving a sufficient gel state in a short time, the mass average molecular weight is preferably 20 million or less.

In terms of imparting high gelling property even at very low viscosity of the curable resin, the mass average molecular weight of the acetone-soluble component in the polymer powder (P1) is preferably 150,000 or more, more preferably 200,000 or more and even more preferably 400,000 or more. In addition, in terms of effective gelling at a given temperature, the mass average molecular weight of the acetone-soluble component in the polymer powder (P1) is more preferably 10 million or less, even more preferably 5 million or less, and particularly preferably 2 million or less.

In the present invention, the gel state may be assessed by the gelling temperature and gelling performance resulted from the following measurement.

In addition, in the present invention, the mass average molecular weight refers to one obtained by the method for measurement of the mass average molecular weight hereinafter.

The mass average molecular weight may be appropriately set by adjustment of the type of the polymerization initiators, the dose of the polymerization initiator, polymerization temperature and the dose of the chain transfer agent. In order to increase the mass average molecular weight, it is preferred to reduce the dose of the polymerization initiator, or reduce the polymerization temperature, or reduce the dose of the chain transfer agent.

(Volume Average Primary Particle Size (Dv))

The volume average primary particle size (Dv) of the polymer powder (P1) is preferably 200 nm or more, and more preferably 500 nm or more. In general, the powder resulted from spray drying or wet coagulating is the cohered powder from aggregation of a plurality of primary particles, but in case of the volume average primary particle size (Dv) being 200 nm or more, the cohered powder tends to break up into the primary particles, such that the powder has excellent dispersity during formulating into the curable resins such as liquid epoxy resins. In addition, in case of the volume average primary particle size (Dv) being 200 nm or more, the total surface area of the particles would be sufficiently reduced, thus having the advantage of the uneasily elevated viscosity of the curable resin composition.

In addition, in terms of fine pitch or filming, the volume average primary particle size (Dv) of the polymer powder (P1) is preferably 8 μm or less, more preferably 5 μm or less, and even more preferably 1 μm or less, and particularly preferably 800 nm or less.

The volume average primary particle size (Dv) may be adjusted by polymerization. For example, the particle size of 250 nm or less is provided by emulsion polymerization, the particle size of 1 mm or less is provided by soap-free emulsion polymerization, and the particle size of 10 mm or less is provided by fine suspension polymerization. In addition, in case of emulsion polymerization, it is appropriately set by adjusting a dose of the emulsifying agent.

For the polymer powder (P1) according to the present invention, the property or structure of the powder is not limited. For example, a plurality of primary particles resulted from polymerization is aggregated to form the cohered powder (secondary particles), and the higher order structures may also be formed. Of these, in case of such cohered powder, it is preferred that primary particles are not firmly bound to one another, but rather are cohered loosely. Thereby, the primary particles are dispersed finely and evenly into the curable resin.

In addition, in terms of good dispersity into the curable resin, the polymer powder (P1) preferably is one including fewer particles with small volume average primary particle size (Dv), and preferably is one having good monodispersity.

In the present invention, the monodispersity for the polymer powder (P1) is represented by a ratio (Dv/Dn) of the volume average primary particle size (Dv) to the number average primary particle size (Dn) of the polymer powder (P1). For the polymer powder (P1), Dv/Dn is preferably 3.0 or less, more preferably 2.0 or less, and even more preferably 1.5 or less. The higher the monodispersity for the polymer powder (P1) (the closer to 1 for Dv/Dn), the more obvious the following tendency: rapid gelling of the curable resin composition in a short time is readily accompanied by storage stability of the curable resin composition.

(Content of Alkali Metal Ions)

The content of alkali metal ions in the polymer powder (P1) is preferably 10 ppm or less. In case of the content of alkali metal ions being 10 ppm or less, the cured material obtained by curing the curable resin composition of the present invention has excellent insulation properties. The content of alkali metal ions is more preferably 5 ppm or less, and even more preferably 1 ppm or less. The curable resin composition can be used in various applications, but in case of use in direct contact with semiconductor wafers, particularly good electric properties are required. In addition, with thinning of the electronic equipment, sometimes poor insulation is caused by the presence of a few ionic impurities. Therefore, in case of the content of alkali metal ions being in the range above, it may be used for extensive uses.

In the present invention, the content of the alkali metal ions in the polymer powder (P1) is the total amount of Na and K ions, provided by the following method for measurement of the content of the alkali metal ions.

(Powder Disintegration Properties)

For the polymer powder (P1) according to the present invention, the particles with particle size of 10 μm or less preferably take a proportion of less than 30 vol %, and preferably of 20 vol % or less in terms of handling. Herein, the so-called particle size for the polymer powder (P1) refers to one for coagulum resulted from spray drying or wet coagulating. At this point, a plurality of primary particles in the polymer powder (P1) is aggregated to form the coagulum.

In the polymer powder (P1) according to the present invention, it is preferred that primary particles are not firmly bound to one another, but rather cohered loosely, and it is preferred that after supersonic irradiation for 5 minutes at a frequency of 42 kHz and a power of 40 W, the particles with particle size of 10 μm or less take a proportion of 30 vol % or more. Furthermore, it is preferred that the proportion of the particles with particle sizes of 10 μm or less after supersonic irradiation is increased by 10 vol % or more compared to that prior to supersonic irradiation.

The supersonic irradiation is carried out after diluting the resulted polymer powder (P1) with ion exchanged water, for example, a device for the particle size distribution measurement of diffractive/scattering (manufactured by Shimadzu Co, "SALD-7100") is used for supersonic irradiation for 5 minutes prior to measurement of a ratio by volume of particles with particle size of 10 μm or less.

The sample concentration of the polymer powder (P1) is appropriately adjusted within the suitable range for a monitor for scattered light strength in the apparatus.

To enable the polymer powder (P1) to have the powder disintegration property, it is preferred that the polymer emulsion with the volume average primary particle size (Dv) of 200 nm or more, preferably of 400 nm to 900 nm, and more preferably of 500 nm to 800 nm is powderized, preferably by spraying recovery, for example.

(Volume Average Secondary Particle Size (Dv))

The volume average secondary particle size (Dv) of the polymer powder (P1) is preferably 6 μm to 300 μm, more preferably 10 μm to 220 μm and even more preferably 20 μm to 200 μm. In case of the polymer powder (P1) having the volume average secondary particle size of 6 μm or more, the polymer powder (P1) does not tend to cohere in the curable resin; and in case of the polymer powder (P1) having the volume average secondary particle size of 300 μm or less, the polymer powder (P1) has excellent dispersity in the curable resin. For the value of the volume average secondary particle size of the polymer powder (P1) in the curable resin, it may be obtained by the same method as that for the volume average primary particle size.

(Moisture Content)

Moisture content in the polymer powder (P1) is preferably 1.5% or less, and more preferably 1.0% or less. In case of the polymer powder (P1) including moisture of 1.5% or less, it is less possible for cracking during shaping of the curable resin composition.

(Sulfate Ion Content)

The polymer powder (P1) includes sulfate ions ($SO_4^{2-}$) of preferably 500 ppm or less, more preferably 300 ppm or less, and even more preferably 100 ppm or less. The curable resin composition for the electronic materials is used at the condition of being in contact with wires or circuit wiring made of metals such as copper or aluminum, and therefore, if there are residual sulfate ions, metallic corrosion is caused, resulting in poor conduction or malfunction. In case of the polymer powder (P1) including sulfate ions of 100 ppm or less, it may be used for extensive uses.

In case of polymerizing the monomer mixture by emulsion polymerization or suspension polymerization to obtain the polymer powder (P1), sulfate esters or sulfonate compounds are used, in addition to sulfate salts. The sulfonate, sulfinate and sulfate ions in these compounds sometimes also cause metallic corrosion.

Therefore, it is preferred to reduce the amount of sulfate or sulfonate compounds used for polymerizing the monomer mixture.

(Curable Resin)

The polymer powder (P1) according to the present invention may be added to the curable resins such as epoxy resin for use. The polymer powder (P1) according to the present invention may be used as the stress relaxation agent and pre-gelling agent for the curable resin. In addition, the so-called stress relaxation agent refers to an additive for reducing the elastic modulus of the cured material from the curable resin composition, and the so-called pre-gelling agent refers to an additive for imparting the gelling property to the curable resin composition.

There is a method for separately adding the stress relaxation agent and the pre-gelling agent into the curable resin composition to provide the curable resin composition with the gelling property and reducing the elastic modulus of the cured material, however, in case of various additives being formulated into the curable resin composition, the curable resin composition is increased in viscosity. Therefore, in applications requiring low viscosity for the curable resin composition, there is strong need for reduction of dose of the additives formulated.

By using the polymer powder (P1) according to the present invention as both the stress relaxation agent and the pre-gelling agent, the amount of the additives formulated into the curable resin composition is reduced, thereby obtaining the curable resin composition with excellent initial viscosity, gelling property, and low elastic modulus of the cured material.

In the present invention, the curable resins are exemplified by the thermosetting resins and the active energy ray curable resins.

The thermosetting resins may be exemplified by epoxy resins, phenol resins, melamine resins, urea resins, oxetane resins, unsaturated polyester resin, alkyd resin, polyurethane resins, acrylic resins and polyimide resins. These may be used alone or in a combination of two or more.

The active energy ray curable resins may be exemplified by those cured at irradiation of ultraviolet ray or e-beam, for example active energy ray curable acrylic resins, active energy ray curable epoxy resins and active energy ray curable oxetane resins.

In addition, the curable resins may be cured by combination of thermosetting and active energy ray curing (dual curing) according to purposes.

Of these, in terms of high insulating property and excellent electric properties suitable in the field of electronic materials, the curable resins are preferably epoxy resins, phenol resins, polyimide resins and oxetane resins.

The epoxy resins may be exemplified by bisphenol A-based epoxy resins such as JER827, JER828, JER834 (produced by Mitsubishi Chemical Co.), and RE-310S (produced by Nippon Kayaku Co.); bisphenol F-based epoxy resins such as JER806L (produced by Mitsubishi Chemical Co.) and RE303S-L (produced by Nippon Kayaku Co.); naphthalene-based epoxy resins such as HP-4032, HP-4032D (produced by Dainippon Ink and Chemicals Incorporated); biphenyl-based epoxy resins such as NC-3000 (produced by Nippon Kayaku Co.) and YX4000 (produced by Mitsubishi Chemical Co.); crystalline epoxy resins such as YDC-1312, YSLV-80XY, YSLV-120TE (produced by Tohto Kasei Co.); alicyclic epoxy resins such as YX8000 (produced by Mitsubishi Chemical Co.) and CEL2021P (produced by Daicel Chemical Co.); and thermostable epoxy resins such as EPN-501H, EPN-501HY, EPN-502H (produced by Nippon Kayaku Co.).

In addition, it is exemplified by hydrogenated bisphenol A-based epoxy resin, bisphenol AD-based epoxy resin, bisphenol E-based epoxy resin, dicyclopentadiene-based epoxy resin, phenol novolac epoxy resin, cresol novolac epoxy resin, brominated epoxy resin and glycidyl amine-based epoxy resin.

In addition, epoxy resins may be exemplified by prepolymers of the aforementioned epoxy resins, or copolymers of the aforementioned epoxy resins such as polyether-modified epoxy resin and silicone-modified epoxy resin with other polymers, and those obtained by epoxy resins having a moiety substituted by a reactive diluting agent having epoxy group.

The reactive diluting agent is exemplified by monoglycidyl compounds such as resorcinol glycidyl ether, t-butyl phenyl glycidyl ether, 2-ethylhexyl glycidyl ether, allyl glycidyl ether, phenyl glycidyl ether, 3-glycidyloxypropyltrimethoxysilane, 3-glycidyloxypropylmethyldimethoxysilane, 1-(3-glycidyloxypropyl)-1,1,3,3,3-pentamethyl siloxane, N-glycidyl-N,N-di[3-(trimethoxysilyl)propyl]amine; diglycidyl compounds such as neopentyl glycol diglycidyl ether, 1,6-hexanediol diglycidyl ether, propylene glycol diglycidyl ether; and mono-alicyclic epoxy compounds such as 2-((3,4)-epoxycyclohexyl)ethyltrimethoxysilane.

These epoxy resins may be used alone or in a combination of two or more.

In the present invention, in terms of providing the epoxy resin composition with the gelling property, epoxy resins are preferably the following epoxy resins and included in an amount of 50 mass % or more: those in the liquid form at the ambient temperature, or those in the solid form at the ambient temperature but in the liquid form at heating prior to full curing.

In addition, in case of the epoxy resin composition according to the present invention being used as a liquid sealing material, epoxy resins are exemplified by bisphenol A-based epoxy resin, hydrogenated bisphenol A-based epoxy resin, bisphenol F-based epoxy resin, bisphenol S-based epoxy resin, 3,3',5,5'-tetramethyl-4,4'-dihydroxydiphenylmethane diglycidyl ether-based epoxy resin, 3,3',5,5'-tetramethyl-4,4'-dihydroxylbiphenyl diglycidyl ether-based epoxy resin, 4,4'-dihydroxybiphenyl diglycidyl ether-based epoxy resin, 1,6-dihydroxy naphthalene-based epoxy resin, phenol novolac epoxy resin, cresol novolac epoxy resin, brominated bisphenol A-based epoxy resin, brominated cresol novolac epoxy resin and bisphenol D-based epoxy resin.

(Curable Resin Composition)

The curable resin composition according to the present invention includes the polymer powder (P1) and the curable resin.

In the curable resin composition, the polymer powder (P1) is formulated preferably in an amount of 5 parts by mass or more, more preferably 10 parts by mass or more and even more preferably 15 parts by mass or more. In case of the polymer powder (P1) being formulated in an amount of 5 parts by mass or more, the polymer powder (P1) shows sufficient effects as the additives. In addition, the polymer powder (P1) is formulated preferably in an amount of 50 parts by mass or less, and more preferably 40 parts by mass or less. Formulation of the polymer powder (P1) in an amount of 50 parts by mass or less enables inhibition of increase in the curable resin composition paste viscosity, and inhibition of possibility of reduction in processability and operation, depending on different utilization.

(Other Additives)

In the curable resin composition according to the present invention, various additives may be formulated in the range without compromising the effect of the present invention.

The additive may be exemplified by conductive fillers such as silver powder, gold powder, nickel powder, copper powder; insulating fillers such as aluminum nitride, calcium carbonate, silica, alumina; thixotropy-imparting agent; mobility enhancing agent; fire retardant; thermostabilizer; antioxidant; ultraviolet absorbent; ion adsorption agent; coupling agent; releasing agent and stress relaxation agent.

For the fire retardant, a well-known one such as a phosphor-based, halogen-based, or inorganic fire retardant may be used, so long as being in the range without deviating from the object of the present invention.

The thermostabilizer may be exemplified by phenol-based, sulfur-based, and phosphor-based antioxidants. The antioxidant may be used individually, and preferably in a combination of phenol/sulfur or phenol/phosphor-based antioxidants.

(Blending)

For the preparation of the curable resin composition according to the present invention, a well-known blending device may be used.

The blending device for obtaining the curable resin composition may be exemplified by a kneader, an attritor, a planetary mixer, a high-speed dissolver, a three-roll mill, a ball mill and a bead mill. These can be used in a combination of two or more.

For the formulation of the additives into the curable resin composition according to the present invention, the formulating sequence is not particularly limited, and for sufficiently exhibiting the effect of the present invention, it is preferred that the polymer powder (P1) is blended as late as possible. In addition, in case of temperature elevation in the system due to shear heating caused by blending, it is preferred to make an effort to prevent the temperature from rising during blending.

The curable resin composition of the present invention may be used as liquid sealing materials such as primary-mounting under-filling materials, secondary-mounting under-filling materials, and grab-top materials in wire bonding; sealing sheets for collectively sealing various chips on the substrate; predispensing type under-filling materials; sealing materials for semiconductors such as sealing sheets for collective sealing on a wafer level, optical adhesive agents; sealing agents for liquid crystal display devices such as sealing materials of various flat-panel displays such as liquid crystal, organic electroluminescence (EL), bonding layers for three-ply copper foil laminates; bonding layers such as die bonding films, die attaching films, interlayer insulation films, cover lay films; bonding pastes such as die bonding pastes, interlayer insulation pastes, conductive pastes, anisotropic conductive pastes; and sealing materials for light-emitting diodes. Of these, the sheet articles such as the sealing sheets for collectively sealing various chips on the substrate, the sealing sheets for collective sealing on a wafer level, die bonding films, die attaching films, interlayer insulation films and cover lay films are preferred.

(Cured Material)

The cured material according to the present invention is obtained by curing the curable resin composition.

In the present invention, in case of epoxy resin being used as curable resin, the curable resin composition is cured, for example, by the curing agents such as anhydride, amine compounds and phenolic compounds. By using the curing agents, the curability of epoxy resins and properties of the cured material are adjusted. Especially when anhydride is used as the curing agent, the cured material has improvement in heat resistance or chemical resistance, which is preferred.

The anhydride may be exemplified by phthalic anhydride, methyl tetrohydrophthalic anhydride, methyl hexahydrophthalic anhydride, hexahydrophthalic anhydride, tetrohydrophthalic anhydride, trialkyl tetrohydrophthalic anhydride, methyl himic anhydride, methylcyclohexene tetracarboxylic anhydride, trimellitic anhydride, pyromellitic dianhydride, benzophenone tetracarboxylic anhydride, ethylene glycol di(trimellitate), glycerol tri(trimellitate), dodecenyl succinic anhydride, polyazelaic anhydride and poly(ethyl octadecandioic acid) anhydride. Of these, for uses intended for weather resistance, light resistance and heat resistance, methyl hexahydrophthalic anhydride and hexahydrophthalic anhydride are preferred. These may be used alone or in a combination of two or more.

The amine compounds may be exemplified by aliphatic polyamines such as ethylene diamine, diethylene triamine, triethylene tetramine, tetraethylene pentaamine, hexamethylenediamine, trimethyl hexamethylenediamine, meta-xylene diamine, 2-methyl pentamethylene diamine, diethylamino propylamine; alicyclic polyamines such as isophorone diamine, 1,3-diamino methyl cyclohexane, methylene bicyclohexylamine, norbornylene diamine, 1,2-diamino cyclohexane, di(4-amino-3-methyldicyclohexyl)methane, diaminodicyclohexyl methane, 2,5 (2,6)-di(aminomethyl)bicyclo[2,2,1]heptane; aromatic polyamine such as diaminodiethyl diphenylmethane, diaminophenylmethane, diaminodiphenyl sulfone, diaminodiphenylmethane m-phenylenediamine, diaminodiethyl toluene. These may be used alone or in a combination of two or more.

For use with weather resistance, light resistance and heat resistance, 2,5(2,6)-di(aminomethyl)bicyclo[2,2,1]heptane and isophorone diamine are preferred. These may be used alone or in a combination of two or more.

The phenolic compounds may be exemplified by phenol novolac resin, cresol novolac resin, bisphenol A, bisphenol F, bisphenol AD and derivatives from diallyl compounds of these bisphenols. Of these, in terms of excellent mechanical strength and curability, bisphenol A is preferred. These may be used alone or in a combination of two or more.

In terms of excellent heat resistance and curability of the cured material, the curing agent is used preferably in an amount of 20-120 parts by mass and more preferably 60-110 parts by mass, relative to 100 parts by mass of epoxy resin. In addition, in terms of dosage of the curing agent, relative to 1 equivalence of epoxy group on a basis of equivalence ratio, it is preferably about 0.7-1.3 equivalences and more preferably about 0.8-1.1 equivalences for anhydride group in case of anhydride; it is preferably about 0.3-1.4 equivalences and more preferably about 0.4-1.2 equivalences for active hydrogen in case of amine compounds; and it is preferably about 0.3-0.7 equivalence and more preferably about 0.4-0.6 equivalence for active hydrogen in case of phenolic compound.

In the present invention, for curing of epoxy resin, optionally a curing accelerant and a latent curing agent may be used.

For the curing accelerant, well-known ones as thermosetting catalysts for epoxy resin may be used, for example, imidazole compounds such as 2-methylimidazole, 2-ethyl-4-methylimidazole; adducts of imidazole compounds with epoxy resin; organo phosphorous compounds such as triphenylphosphine; borates such as tetraphenylphosphine tetraphenylborate; and 1,8-diazabicyclo[5.4.0]undec-7-ene (DBU). These may be used alone or in a combination of two or more.

In case of the curing accelerant, relative to 100 parts by mass of epoxy resin, the curing accelerant is added usually in an amount of 0.1-8 parts by mass, preferably 0.5-6 parts by mass.

The latent curing agent is in the solid form at the ambient temperature, and is fluidized at heating for curing of epoxy resin, functioning as the curing agent.

The latent curing agent may be exemplified by organic acid hydrazides, such as dicyanodiamide, carbohydrazide, oxalic dihydrazide, malonic dihydrazide, succinic dihydrazide, iminodiacetic dihydrazide, adipic dihydrazide, pimelic dihydrazide, suberic dihydrazide, azelaic dihydrazide, sebacic dihydrazide, dodecyl dihydrazide, cetyl dihydrazide, maleic dihydrazide, fumaric dihydrazide, diglycollic dihydrazide, tartaric dihydrazide, malic dihydrazide, m-phthalic dihydrazide, terephthalic dihydrazide, 2,6-naphthalenedicarboxylic dihydrazide, 4,4'-biphenyl dihydrazide, 1,4-naphthalic dihydrazide, Amicure VDH and Amicure UDH (both are trade names, produced by Ajinomoto Co.), citric trihydrazide and the like, as well as various amine adduct compounds. These may be used alone or in a combination of two or more.

In the present invention, in case of oxetane resin being used as curable resin, curing is carried out, for example, by formulating such curing agent as anhydride or by curing catalyst for initiation of ring opening and the polymerization of oxetane ring by heating. The oxetane resin may be exemplified by EHO, OXBP, OXMA, OXTP (produced by Ube Industries).

The amount of the curing agent or curing catalyst used is the same as that in epoxy resin.

In case of thermosetting resin being used as the curable resin, curing conditions include about 10 minutes to 5 hours at 80-180° C.

In addition, in case of active energy ray curable resin being used as curable resin, the active energy ray used may be exemplified by electron beam, ultraviolet ray, gamma ray and infrared ray. In addition, in case of curing by ultraviolet ray, a well-known ultraviolet irradiation device with high-pressure mercury-vapor lamp, excimer lamp or metal halide lamp may be used for curing by active energy ray.

Ultraviolet exposure is about 50-1,000 mJ/cm$^2$. In case of curing by electron beam, a well-known electron beam irradiation device may be used, with electron beam exposure of about 10-100 kGy.

The cured material obtained by curing the curable resin composition according to the present invention may be used in various applications representative by electronic materials, especially useful as semiconductor sealing materials or adhesive agents requiring low elastic modulus.

(ii) Polymer Powder (P2)

The polymer powder (P2) according to the present invention is one including the acetone-soluble component of 2 mass % to 35 mass %, wherein the acetone-soluble component has the mass average molecular weight of 100,000 or more, and the polymer powder (P2) has the volume average primary particle size (Dv) of 200 nm or more.

<Acetone-Soluble Component>

In the present invention, the so-called acetone-soluble component refers to the dissolved mass % obtained after a given amount of polymer powder (P2) dissolved into acetone at 50 folds by mass is refluxed for 6 hours at 70° C. More particularly, it refers to one obtained by the following method for measurement of the acetone-soluble component.

In case of the polymer powder (P2) including the acetone-soluble component of 35 mass % or less, the glass transition temperature of the cured material when formulating the polymer powder (P2) into the curable resin composition is inhibited from dropping.

For imparting high gelling property even in case of very low viscosity of the curable resin, the acetone-soluble component in the polymer powder (P2) is preferably 2 mass % or more, preferably 5 mass % or more, and more preferably 8 mass % or more. In addition, in terms of preventing a drop in glass transition temperature of the cured material, the polymer powder (P2) includes the acetone-soluble component of 35 mass % or less, preferably less than 30 mass %, more preferably 25 mass % or less, and even more preferably 20 mass % or less.

The acetone-soluble component may be appropriately set by adjustment of the content of the crosslinking monomer in the monomer materials. To increase the acetone-soluble component, it is sufficient to reduce the content of the crosslinking monomer; and to decrease the acetone-soluble component, it is sufficient to increase the content of the crosslinking monomer.

<Mass Average Molecular Weight of the Acetone-Soluble Component>

If the acetone-soluble component in the polymer powder (P2) has the mass average molecular weight of 100,000 or more, high gelling property may be imparted with a small addition amount and flowing of the curable resin is inhibited even at high temperature. In terms of no drop in solubility in the curable resin and achieving a sufficient gel state in a short time, the mass average molecular weight of the acetone-soluble component is preferably 20 million or less.

In terms of imparting high gelling property even at very low viscosity of the curable resin, the mass average molecular weight of the acetone-soluble component in the polymer powder (P2) is preferably 200,000 or more, more preferably 300,000 or more and even more preferably 400,000 or more. In addition, in terms of effective gelling at a given temperature, the mass average molecular weight of the acetone-soluble component in the polymer powder (P2) is more preferably 10 million or less, even more preferably 5 million or less, and particularly preferably 2 million or less.

In the present invention, the gel state may be assessed by the gelling temperature and gelling performance resulted from the following measurement.

In addition, in the present invention, the mass average molecular weight refers to one obtained by the method for measurement of the mass average molecular weight hereinafter.

The mass average molecular weight may be appropriately set by adjustment of the type of the polymerization initiators, the dose of the polymerization initiator, polymerization temperature and the dose of the chain transfer agent. In order to increase the mass average molecular weight, it is preferred to reduce the dose of the polymerization initiator, or reduce the polymerization temperature, or reduce the dose of the chain transfer agent.

<Volume Average Primary Particle Size>

The volume average primary particle size (Dv) of the polymer powder (P2) is 200 nm or more, preferably 300 nm or more, more preferably 500 nm or more, and even more preferably 600 nm or more. In case of the volume average primary particle size (Dv) being 200 nm or more, the total surface area of the particles would be sufficiently reduced, thus having the advantage of the uneasily elevated viscosity of the curable resin composition. In addition, in terms of fine pitch or filming, the volume average primary particle size (Dv) of the polymer powder (P2) is preferably 8 μm or less, more preferably 5 μm or less, and even more preferably 1 μm or less.

The volume average primary particle size (Dv) may be appropriately adjusted by polymerization. For example, the particle size of 250 nm or less is provided by emulsion polymerization, the particle size of 1 mm or less is provided by soap-free emulsion polymerization, and the particle size of 10 mm or less is provided by fine suspension polymerization. In addition, in case of emulsion polymerization, it is appropriately set by adjusting the dose of the emulsifying agent.

In addition, the polymer powder (P2) is preferably one having good monodispersity. In the present invention, the monodispersity for the polymer powder (P2) is represented by a ratio (Dv/Dn) of the volume average primary particle size (Dv) to the number average primary particle size (Dn) of the polymer powder (A). For the polymer powder (P2), Dv/Dn is preferably 3.0 or less, more preferably 2.0 or less, and even more preferably 1.5 or less. The higher the monodispersity for the polymer powder (A) (the closer to 1 for Dv/Dn), the more obvious the following tendency: rapid gelling of the curable resin composition in a short time is readily accompanied by storage stability of the curable resin composition.

For the polymer powder (P2), the property or structure of the powder is not limited. For example, a plurality of primary particles resulted from polymerization is aggregated to form the cohered powder (secondary particles), and the higher order structures may also be formed. Of these, in case of such cohered powder, it is preferred that primary particles are not firmly bound to one another, but rather are cohered loosely. Thereby, the primary particles are dispersed finely and evenly into the curable resin.

Furthermore, for recovery of the polymer powder (P2) in the form of powder, usually the powder resulted from spray drying or wet coagulating is the cohered powder from aggregation of a plurality of primary particles, but in case of volume average primary particle size (Dv) of 200 nm or more, the cohered powder tends to break up into the primary particles, thus having excellent dispersity in epoxy resin.

<Refractivity>

In the present invention, the refractivity of the polymer powder (P2) is not particularly limited, and is preferably 1.48 or more and 1.51 or less at 20° C. In case of vinyl polymer being in the form of multilayer structural particles, it is preferred that each of the layers has the refractivity of 1.48 or more and 1.51 or less. In case of the refractivity being in the range, the cured materials resulted from formulation of the polymer powder (P2) have excellent transparency. From the viewpoint of transparency of the cured materials, the refractivity of the polymer powder (P2) is preferably 1.49 or more, and more preferably 1.50 or more.

In addition, in the present invention, for the refractivity of the polymer powder (P2) at 20° C., the refractivity values (1.490 for poly(methyl methacrylate), 1.483 for poly(n-butyl methacrylate), 1.591 for polystyrene) of its homopolymer at 20° C. recorded in "POLYMER HANDBOOK" (Wiley Interscience Corp.) are used. In addition, the refractivity of the copolymer may be calculated by its volume ratio.

<Glass Transition Temperature>

In the present invention, the glass transition temperature of the polymer powder (P2) is not particularly limited, and is preferably 0° C. or more. In case of the vinyl polymer being in the form of multilayer structural particles, the glass transition temperature is 0° C. or more for each of the layers. In case of the glass transition temperature being 0° C. or more, the cured materials may be inhibited from reduction in the glass transition temperature, even in case of a large amount thereof being formulated into the curable resin composition, and may also be used in applications requiring high heat resistance. In addition, in terms of effective gelling at a given temperature, the glass transition temperature of 250° C. or less is preferred.

In addition, in the present invention, the glass transition temperature of vinyl polymer may be calculated by the Fox formula. In case of the vinyl polymer being a homopolymer, it is calculated from the standard assay values recorded in "Polymer Data Handbook" (edited by the Polymer Society), and in case of being a copolymer, it is calculated from the Tg of the homopolymer of each of monomeric units by formula (1).

The Fox formula is given as follows:

$$1/(273+Tg) = \Sigma(wi/(273+Tg_i))$$  Formula (1)

wherein, Tg is Tg of the copolymer (° C.), wi is a mass fraction of the monomer i, and $Tg_i$ is Tg (° C.) of the homopolymer from the polymerization of the monomer i.

<Metal Ion Content>

The polymer powder (P2) preferably includes the alkali metal ion of 10 ppm or less, more preferably 5 ppm or less and even more preferably 1 ppm or less. The curable resin composition may be used in various applications, but sometimes causes poor insulation due to the presence of a few ionic impurities.

Therefore, in case of the content of alkali metal ions being in the range above, it may be used for extensive uses. In addition, it may also be used in case of needing a large amount of pre-gelling agent.

In the present invention, the content of the alkali metal ions in the polymer powder (P2) is the total amount of Na and K ions, provided by the following method for measurement of the content of the alkali metal ions.

<Sulfate Ion Content>

The polymer powder (P2) preferably includes sulfate ions ($SO_4^{2-}$) of 20 ppm or less. The curable resin composition for the electronic materials is used at the condition of being in contact with wires or circuit wiring made of metals such as copper or aluminum, and therefore, if there are residual sulfate ions, metallic corrosion is caused, resulting in poor conduction or malfunction. In case of the polymer powder (P2) including sulfate ions of 20 ppm or less, it may be used for extensive uses.

In case of polymerizing the vinyl monomers as raw materials by emulsion polymerization or suspension polymerization to obtain the polymer powder (P2), sulfate esters or sulfonate compounds are used, in addition to sulfate salts. The sulfonate, sulfinate and sulfate ions in these compounds sometimes also cause metallic corrosion.

Therefore, it is preferred to reduce the amount of sulfate or sulfonate compounds used for polymerizing the vinyl monomers raw materials (a2).

<Monomer Composition (a2)>

In the present invention, the vinyl polymer (A2) is obtained by polymerizing the vinyl monomer raw material (a2) that is capable of free radical polymerization.

The vinyl monomer raw material (a2) that is capable of free radical polymerization is exemplified by: (meth)acrylate such as methyl(meth)acrylate, ethyl(meth)acrylate, n-propyl (meth)acrylate, isopropyl(meth)acrylate, n-butyl(meth)acrylate, t-butyl(meth)acrylate, isobutyl(meth)acrylate, n-hexyl (meth)acrylate, n-octyl(meth)acrylate, 2-ethylhexyl(meth) acrylate, cyclohexyl(meth)acrylate, benzyl(meth)acrylate, phenyl(meth)acrylate, nonyl(meth)acrylate, decyl(meth) acrylate, dodecyl(meth)acrylate, stearyl(meth)acrylate, t-butyl cyclohexyl(meth)acrylate, isobornyl(meth)acrylate, tricyclo[5.2.1.02.6]dec-8-yl(meth)acrylate, dicyclopentadienyl (meth)acrylate, N,N-dimethylaminoethyl(meth)acrylate, and N-methyl-2,2,6,6-tetramethylpiperidyl(meth)acrylate; vinyl cyanide monomers such as (methyl) acrylonitrile; aromatic vinyl monomers such as styrene, α-methylstyrene, vinyltoluene; carboxyl group-containing vinyl monomers such as acrylic acid, methacrylic acid, butenoic acid, maleic acid, itaconic acid, fumaric acid, isocrotonic acid, salicylic acid, vinyloxyacetic acid, allyloxyacetic acid, 2-(meth)acryloylpropanoic acid, 3-(meth)acryloylbutyric acid, and 4-vinylbenzoic acid; hydroxyl group-containing vinyl monomers such as hydroxymethyl(meth)acrylate, 2-hydroxyethyl (meth)acrylate, 2-hydroxylpropyl(meth)acrylate, 2-hydroxylbutyl(meth)acrylate, 4-hydroxylbutyl(meth)acrylate, and glycerol mono(meth)acrylate; glycidyl group-containing vinyl monomers such as glycidyl(meth)acrylate; (meth)acrylamide; vinyl monomers such as vinyl pyridine, vinyl alcohol, vinyl imidazole, vinyl pyrrolidone, vinyl acetate and 1-vinyl imidazole; itaconates such as monomethyl itaconate, monoethyl itaconate, monopropyl itaconate, monobutyl itaconate, dimethyl itaconate, diethyl itaconate, dipropyl itaconate and dibutyl itaconate; fumarates such as monomethyl fumarate, monoethyl fumarate, monopropyl fumarate, monobutyl fumarate, dimethyl fumarate, diethyl fumarate, dipropyl fumarate and dibutyl fumarate; and maleates such as monomethyl maleate, monoethyl maleate, monopropyl maleate, monobutyl maleate, dimethyl maleate, diethyl maleate, dipropyl maleate and dibutyl maleate.

These monomers may be used alone or in a combination of two or more. Of these, in terms of easy free radical polymerization and easy emulsion polymerization, (meth)acrylate is preferred. Furthermore, of these, in terms of excellent stability in polymerization, the monomer raw material (a2) including 70-99 mass % of methyl methacrylate and 30-1 mass % of vinyl monomer other than methyl methacrylate is preferred.

In addition, in the present invention, "(meth)acrylate group" represents "acrylate group" or "methacrylate group".

In the present invention, the monomer raw material (a2) preferably is the vinyl monomer raw material other than methyl methacrylate including butyl methacrylate and at least one functional group containing monomer as, selected from a vinyl monomer containing carboxyl, a vinyl monomer containing hydroxyl and a vinyl monomer containing glycidyl. This provides the cured material obtained by curing the composition with excellent transparency. Among others, it is preferred to use the monomer raw material (a2) including 70 mass % to 95 mass % of methyl methacrylate, 1 mass % to 10 mass % of butyl methacrylate, and 0 mass % to 15 mass % of the functional group containing monomer.

In terms of transparency of the cured material, the monomer raw material (a2) includes at least one functional group containing monomer, selected from a vinyl monomer containing carboxyl, a vinyl monomer containing hydroxyl and a vinyl monomer containing glycidyl, preferably of 2 mass % or more, more preferably 4 mass % or more, and even more preferably 6 mass % or more. In addition, from the viewpoint of polymerization stability, the content of at least one functional group containing monomer is preferably 30 mass % or less, and more preferably 20 mass % or less.

In terms of easy free radical polymerization and easy emulsion polymerization, for the vinyl monomer containing carboxyl, methacrylic acid is preferred.

In terms of easy free radical polymerization and easy emulsion polymerization, for the vinyl monomer containing hydroxyl, 2-hydroxyethyl(meth)acrylate is preferred.

In terms of easy free radical polymerization and easy emulsion polymerization, for the vinyl monomer containing glycidyl, glycidyl(meth)acrylate is preferred.

These carboxyl group-containing vinyl monomers, hydroxyl group-containing vinyl monomers and glycidyl group-containing vinyl monomers may be used alone or in a combination of two or more.

In the present invention, in case of multistage polymerization of 2 stages or more to obtain the vinyl polymers, for the monomer raw materials in each stage, the following monomer raw material (a2) is preferred. The monomer raw material (a2) includes 2 mass % or more of at least one functional group containing monomer, selected from a vinyl monomer containing carboxyl, a vinyl monomer containing hydroxyl and a vinyl monomer containing glycidyl. In addition, the composition of the monomer raw materials in each stage of multistage polymerization may be the same or different.

<Polymerization Method>

In the present invention, in terms of easiness in obtaining the spheric particles and easiness in controlling particle morphology, for the polymerization of the vinyl monomer raw material (a2), emulsion polymerization, soap-free emulsion polymerization, swelling polymerization, miniemulsion polymerization, dispersion polymerization and fine suspension polymerization are preferred. Of these, in terms of the polymers having excellent dispersity and having a particle size corresponding to fine pitch, the soap-free emulsion polymerization is more preferred.

In terms of excellent mobility of the curable resin composition without increased viscosity, it is preferred for the vinyl polymer (A2) to be in the form of sphere.

Without particular limitation in inner morphology for the vinyl polymer (primary particles) (A2), it may also have a variety of commonly-known morphologies such as core-shell structure or gradient structure, even if it is uniform in polymer composition, molecular weight, glass transition temperature, solubility parameters.

The methods for control of inner morphology of the vinyl polymer (A2) may be exemplified by the methods for preparation of multilayer structural particle with inner and outer sides having different solubility parameter or molecular weight. This method is preferred in terms of easiness in providing storage stability (pot life) and gelling rate of the curable resin composition.

The methods for control of inner morphology of the vinyl polymer (A2) with high industrial practicability may be exemplified by one including dropping the vinyl monomer mixtures having different compositions in multiple stages in sequence for polymerization.

The method for determining whether the vinyl polymer (A2) has the core-shell structure may be exemplified by one including confirmation of the following requirements to be fulfilled at the same time: reliable growth in particle size of the polymer particles sampled during polymerization, and varied minimum filming temperature (MFT) or varied solubility in various solvents, of the polymer particles sampled during polymerization.

In addition, it is exemplified by the following methods: confirming whether a structure of concentric circles is present by observing the vinyl polymer slices with a transmission electron microscope (TEM); or confirming whether a structure of concentric circles is present by observing the frozen-cracked polymer slices with a scanning electron microscope (SEM).

<Polymerization Auxiliaries>

For the polymerization of the vinyl monomer raw material (a2), the polymerization initiator, emulsifying agent, dispersion stabilizer and chain transfer agent may be used.

<Polymerization Initiator>

For the polymerization initiators, a well-known one may be used. The polymerization initiator free of metal ions is preferred, because there are no residual metal ions when powderizing the vinyl polymer by spray drying.

The polymerization initiator free of metal ions may be exemplified by azo compounds such as 2,2'-azodiisobutyronitrile, 4,4'-azodi-(4-cyanopentoic acid), and 2,2'-azodi-[N-(2-carboxylethyl)-2-methylpropionamidine]; persulfate compounds such as ammonium persulfate; organic peroxides such as dicumyl hydroperoxide, p-menthane hydroperoxide, cumyl hydroperoxide, and t-butyl hydroperoxide; and the redox-based initiators with the persulfate compounds or the organic peroxides as one component.

These polymerization initiators may be used alone or in a combination of two or more.

Of these, ammonium persulfate, 2,2'-azodiisobutyronitrile, 4,4'-azodi-(4-cyanopentoic acid) and 2,2'-azodi-[N-(2-carboxylethyl)-2-methylpropionamidine] are preferred.

The polymerization temperature may be, for example, in the range of 40° C. to 90° C., also depending on the type of the polymerization initiators.

<Emulsifying Agent>

For the emulsifying agent, a well-known one may be used, for example alkali salts or ammonium salts of higher fatty acids such as disproportionated rosin acid, oleic acid and stearic acid, sulfonic acids such as dodecylbenzene sulfonic acid; and non-ionic emulsifying agents.

The emulsifying agents may be used alone or in a combination of two or more.

Of these, in terms of the polymer powder (P2) free of residual metal ions, the ammonium type anionic emulsifying agents and non-ionic emulsifying agents free of metal ions are preferred.

In terms of excellent stability in emulsion polymerization, ammonium lauryl sulfate and ammonium di-(2-ethylhexyl) succinate are preferred as the ammonium type anionic emulsifying agents. In terms of excellent stability in emulsion polymerization, polyoxyethylene (85) monotetradecyl ether and polyoxyethylene distyrenated phenyl ether are preferred as the non-ionic emulsifying agent.

<Dispersion Stabilizer>

The dispersion stabilizer is exemplified by water-insoluble inorganic salts such as calcium phosphate, calcium carbonate, aluminum hydroxide and starch-based silica; non-ionic high-molecular compounds such as polyvinyl alcohol, polyethylene oxide and cellulose derivative; and anionic high-molecular compounds such as polyacrylic acid or salt thereof, polymethacrylic acid or salt thereof, and copolymer of methacrylate and methacrylic acid or salt thereof. Of these, in terms of excellent electric properties, the non-ionic high-molecular compounds are preferred. In addition, in terms of both electric properties and polymerization stability, the dispersion stabilizers may be used in a combination of two or more, depending on the purposes.

<Chain Transfer Agent>

The chain transfer agents may be exemplified by thiols such as n-dodecylthiol, tert-dodecylthiol, n-octylthiol, tert-octylthiol, n-tetradecylthiol, n-hexylthiol and n-butylthiol; halogen compounds such as carbon tetrachloride and ethylene bromide; and α-methylstyrene dimer.

These chain transfer agents may be used alone or in a combination of two or more.

<Powder Recovering (Formulation Method)>

In the present invention, well-known powderizing methods are used for powderizing the vinyl polymer (A2) emulsion, such as spray drying, freeze drying and freezing. Of these, in terms of excellent dispersity of the polymer powder (P2) in the curable resin, spray drying is preferred.

The spray-drying process includes spraying of the emulsion in droplet and drying it by hot air. The method for producing the droplets is exemplified by rotating disc, pressurizing nozzle, two-fluid nozzle, pressurizing two-fluid nozzle. Without particular limitation, the capacity for the drying apparatus may be in the small scale as used in the laboratory to the large scale as used in industry. Without particular limitation, where an inlet for supply of hot air for drying in the drying apparatus and an outlet of hot air for drying and of the dried powder are located may be the same as that in the commonly used spray drying apparatus. In terms of excellent dispersity of the polymer powder (P2) in the resulted curable resin composition, the temperature of hot air introduced into the apparatus (inlet temperature), i.e. the top temperature of hot air contacting with the vinyl polymer, is preferably 100-200° C., and more preferably 120-180° C.

For spray drying, the vinyl polymer emulsions may be used alone or in a mixture. In addition, in order to improve such powder properties as blocking and bulk density during spray drying, the inorganic filling agents such as silica, talc and calcium carbonate, and polyacrylate, polyvinyl alcohol and polyacrylamide may also be added.

In addition, optionally the antioxidant or additives may also be added for spray drying.

<Powder Disintegration Properties>

For the polymer powder (P2), the particles with particle size of 10 μm or less preferably take a proportion of less than 30 vol %, and preferably of 20 vol % or less in terms of handling. Herein, the so-called particle size for the polymer powder (P2) refers to one for coagulum resulted from spray drying or wet coagulating. At this point, a plurality of primary particles in the polymer powder (P2) is aggregated to form the coagulum.

In the polymer powder (P2) according to the present invention, primary particles are not firmly bound one another, but rather cohered loosely, and after supersonic irradiation for 3 minutes at a frequency of 42 kHz and a power of 40 W, the particles with particle size of 10 μm or less take a proportion of 30 vol % or more. It is preferred that the proportion of the particles with particle size of 10 μm or less after supersonic irradiation is increased by 10 vol % or more compared to that prior to supersonic irradiation. After supersonic irradiation for 3 minutes at a frequency of 42 kHz and a power of 40 W, the particles with particle size of 10 μm or less take a proportion of preferably 30 vol % or more, and more preferably of 50 vol % or more.

The supersonic irradiation is carried out after diluting the resulted polymer powder (P2) with ion exchanged water, for example, the device for the particle size distribution measurement of diffractive/scattering (manufactured by Shimadzu Co., "SALD-7100") is used for supersonic irradiation for 3 minutes and measurement of the ratio by volume of particles with particle size of 10 μm or less.

The sample concentration of the polymer powder (P2) is appropriately adjusted within the suitable range in a monitor for scattered light strength in the apparatus.

<Curable Resin Composition>

The polymer powder (P2) according to the present invention may be added to the curable resin for use.

<Curable Resin>

The curable resin used in the present invention may be exemplified by epoxy resins such as bisphenol A-based epoxy resin, bisphenol F-based epoxy resin, bisphenol S-based epoxy resin, orthocresol novolac epoxy resin, alicyclic epoxy resin, triglycidyl isocyanurate, aliphatic epoxy resin.

These may be used alone or in a combination of two or more.

In the present invention, in terms of providing the epoxy resin composition with the gelling property, epoxy resins are preferably the following epoxy resins and included in an amount of 50 mass % or more: those in the liquid form at the ambient temperature, or those in the solid form at the ambient temperature but in the liquid form at heating prior to full curing. Furthermore, of these, in terms of excellent transparency and heat resistance, and suitability for semiconductor materials, the alicyclic epoxy resin is preferred.

The alicyclic epoxy resin may be exemplified by 3,4-epoxycyclohexylmethyl-3',4'-epoxycyclohexanecarboxylate (Celloxide 2021), adduct of 3,4-epoxycyclohexylmethyl-3',4'-epoxycyclohexanecarboxylate with ε-caprolactone dimer (Celloxide 2081), 1,2,8,9-diepoxylimonene (Celloxide 3000) (all produced by DAICEL Co.); bisphenol A-based hydrogenated alicyclic epoxy resin (YX-8000, YX-8034 produced by Mitsubishi Chemical Co., EPICLON 750 produced by Dainippon Ink and Chemicals Incorporated).

<Curable Resin Composition and Formulation>

The curable resin composition according to the present invention includes the polymer powder (P2) and the curable resin.

In the curable resin composition, the polymer powder (P2) is formulated preferably in an amount of 5 parts by mass or more, more preferably 10 parts by mass or more and even more preferably 15 parts by mass or more. Formulation of the polymer powder (P2) in an amount of 5 parts by mass or more will enable a sufficient gel state, and prevent the curable resin composition from exudation or pattern disorder. In addition, the polymer powder (P2) is formulated preferably in an amount of 50 parts by mass or less, and more preferably 30 parts by mass or less. Formulation of the polymer powder (P1) in an amount of 50 parts by mass or less enables inhibition of increase in paste viscosity of the curable resin composition, and excellent processability and operation for preparation of various materials from the curable resin composition according to the present invention.

In addition, for manifestation of desired gelling property, a plurality of polymer powders (P2) with different gelling temperatures may also be combined.

The polymer powder (P2) according to the present invention may be added to the curable resin and used as the pre-gelling agent for achieving the gel state.

<Other Additives>

In the curable resin composition according to the present invention, various additives may be formulated in the range without compromising the effect of the present invention.

The additives to be used may be exemplified by the conventional additives such as silicone-based or fluorine-based defoamer, leveling agent, silane coupling agent such as γ-glycidyloxypropyl trimethoxysilane, surfactant, filler, fire retardant, colorant, antioxidant, ultraviolet absorbent, ion adsorption agent, plasticizer, pigment, releasing agent, glass beads, inorganic particles, and stress relaxation agent.

The antioxidant may be exemplified by phenol-based, sulfur-based, and phosphor-based antioxidants. The antioxidant may be used individually, and preferably in a combination of phenol/sulfur or phenol/phosphor-based antioxidants.

Well-known plasticizers may be used, for example phthalate, aliphatic diester, polyester-based plasticizer, epoxy-based plasticizer, phosphate-based plasticizer, and trimellitate-based plasticizer.

For the fire retardant, a well-known one such as a phosphor-based, halogen-based, or inorganic fire retardant may be used, so long as being in the range without deviating from the object of the present invention.

The inorganic particles may be exemplified by the conductive fillers such as silver powder, gold powder, nickel powder, copper powder; and the insulating fillers such as aluminum nitride, calcium carbonate, silica and alumina.

<Blending>

For the preparation of the curable resin composition according to the present invention, a well-known blending device may be used.

The blending device for obtaining the curable resin composition may be exemplified by a kneader, an attritor, a planetary mixer, a high-speed dissolver, a three-roll mill, a ball mill and a bead mill. In addition, these can be used in a combination of two or more.

For the formulation of the additives into the curable resin composition according to the present invention, the formulating sequence is not particularly limited, and for sufficiently exhibiting the effect of the present invention, it is preferred that the polymer powder (P2) is blended as late as possible. In addition, in case of temperature elevation in the system due to shear heating caused by blending, it is preferred to make an effort to prevent the temperature from rising during blending.

The curable resin composition according to the present invention has the total light transmittance of preferably 70.0% or more, and more preferably 80.0% or more, relative to that of the cured material, having thickness of 3 mm, obtained by curing the curable resin, at 23° C. Furthermore, the curable resin composition according to the present invention has the total light transmittance of preferably 70.0% or more, and more preferably 80.0% or more, relative to that of the cured material having thickness of 3 mm, obtained by curing the curable resin at 120° C.

In case of the transmittance being below such range, the luminescence efficiency is lowered and performance sometimes is degraded when used as the sealing material for optical semiconductors.

The cured material obtained by curing the curable resin composition according to the present invention by formulation of the polymer powder (P2) has a reduced elastic modulus. Thereby, it is expected to have effects in inhibiting the cured material from warping and cracking, inhibiting from warping and cracking after various environmental tests, and inhibiting from peeling after a moisture absorption test.

The curable resin composition according to the present invention may be utilized for various uses, such as transparent under-filling materials, transparent liquid sealing materials, transparent sealing sheets, transparent die attaching films, transparent die attaching pastes, sealing materials for light-emitting diodes, transparent adhesive agents, optical adhesive agents, and various sealing materials of various flat-panel displays such as liquid crystal and organic EL. Of these, it may be preferably used as the transparent under-filling materials, transparent liquid sealing materials, transparent sealing sheet, and sealing materials for optical semiconductors such as light-emitting diodes.

<Curing>

The cured material according to the present invention is obtained by curing the curable resin composition according to the present invention.

The conditions for curing are appropriately decided by type or content of each of components in the curable resin composition. The temperature for curing is usually 80-180° C.

In the present invention, the curable resin composition is cured by using the curing agents such as anhydrides, amine compounds, and phenolic compounds.

For the anhydrides, the aforementioned ones may be used.

For the amine compounds, the aforementioned ones may be used.

For the phenolic compounds, the aforementioned ones may be used.

In case of using the curable resin composition according to the present invention as the sealing material for optical semiconductors, the preferred curing agents include those providing relatively less color. For example, preferably the anhydride-based curing agent is used, and more preferably alicyclic anhydride-based curing agent is used. It is exemplified specifically by hexahydrophthalic anhydride, methyl hexahydrophthalic anhydride, tetrohydrophthalic anhydride and hydrogenated methyl Nadic anhydride.

These may be used alone or in a combination of two or more.

In terms of excellent heat resistance and curability of the cured material from the curable resin, the curing agent is used preferably in an amount of 50-150 parts by mass and more preferably 60-140 parts by mass, relative to 100 parts by mass of curable resins. More specifically, in case of the anhydrides, preferably 0.7-1.3 equivalences, and more preferably 0.8-1.1 equivalences are used, based on the anhydride group, relative to 1 equivalence of the epoxy group. In addition, in case of the amine compounds, preferably 0.3-1.4 equivalences, and more preferably 0.4-1.2 equivalences are used, based on the active hydrogen, relative to 1 equivalence of the epoxy group. Furthermore, in case of the phenolic compounds, preferably 0.3-0.7 equivalence, and more preferably 0.4-0.6 equivalence is used, based on the active hydrogen, relative to 1 equivalence of the epoxy group.

In the present invention, the curing accelerant may also be used in the range without compromising the transparency of the cured material according to the present invention.

The curing accelerant functions to accelerate the reaction of the curable resin with the curing agent, and in case of use of the curable resin composition according to the present invention as the sealing material for optical semiconductors, the curing accelerant causing less coloring of the cured material is preferred.

The curing accelerant may be exemplified by organic phosphine-based curing accelerants such as triphenylphosphine and diphenylphosphine; imidazole-based curing accelerants such as 2-methylimidazol, 2-phenyl-4-methylimidazole and 2-phenylimidazole; tertiary amine-based curing accelerants such as 1,8-diazabicyclo(5,4,0)undecylene-7, triethanolamine and benzylmethylamine; and tetraphenylborate-based curing accelerants such as tetraphenylphosphonium tetraphenylborate.

These may be used alone or in a combination of two or more.

Relative to 100 mass % of curable resin, the curing accelerant is formulated in an amount of 0.05 mass % to 5 mass %.

The cured material according to the present invention may preferably be used as the sealing material for electric/electronic parts, for example as the insulation material. Furthermore, it is useful as the sealing material for optical semiconductors, optical adhesive agents and various sealing agents, due to excellent transparency and heat resistance.

EMBODIMENTS

In the following, the present invention will be described in detail by embodiments, but not limited to these embodiments.

<Preparation and Assessment of the Polymer Powder (P1)>

(1) Primary Particle Size and Monodispersity

The device for the particle size distribution measurement of laser diffractive/scattering (produced by Shimadzu Corporation, "SALD-7100") was used to measure the volume average primary particle size (Dv) and number average primary particle size (Dn) by diluting the polymer emulsion with ion exchanged water.

The refractivity was calculated by composition of the monomer added.

The median values were used for average size. In addition, the monodispersity (Dv/Dn) was calculated by values of Dv and Dn.

The sample concentration of the polymer emulsion was appropriately adjusted within the suitable range in a monitor for scattered light strength in the apparatus.

(2) Secondary Particle Size

The volume average secondary particle size (Dv) was calculated in the same manner as for the volume average primary particle size, except for diluting the polymer powder (P1) with ion exchanged water.

(3) Acetone-Soluble Component 1 g of the polymer powder (P1) was dissolved into 50 g of acetone, refluxed for 6 hours at 70° C. and extracted, and then was centrifugalized for 30 minutes by a centrifuging device (manufactured by Hitachi Co., "CRG SERIES") at 14,000 rpm at 4° C. The separated acetone-soluble component was removed by decantation, and the acetone-insoluble component was dried for 24 hours in a vacuum drier at 50° C. prior to the measurement of mass. The acetone-soluble component (%) is calculated by the following formula.

(Acetone-soluble component)=(1−the mass of acetone-insoluble component)×100

(4) Molecular Weight of the Acetone-Soluble Component

The gel permeation chromatograph was used to measure the mass average molecular weight (Mw) of the acetone-soluble component in the polymer powder (P1). In addition, the number average molecular weight (Mn) was also measured.

Device: HLC8220, manufactured by Tosoh Corp.

Column: TSKgel SuperHZM-M (inner diameter 4.6 mm×length 15 cm); number of columns: 4; exclusion limit: $4 \times 10^6$ Temperature: 40° C.

Carrier: tetrahydrofuran

Flow rate: 0.35 ml/min

Sample concentration: 0.1%

Sample load: 10 μl

Standard: polystyrene (5) Content of Alkali Metal Ion 20 g of the polymer powder (P1) was weighed into a glass-made pressure vessel, and 200 ml of ion exchanged water was added with a measuring cylinder prior to capping and vigorous shaking and mixing for its uniform dispersion, to obtain a dispersion of the polymer powder (P1). Thereafter, the resulted dispersion was placed into a gear oven at 95° C. for 20 hours, for extraction of the ionic component in the polymer powder (P1).

Subsequently, the glass vessel was taken out of the oven and cooled, and the dispersion was filtered by 0.2 μm cellulose mixed ester-made film filter (manufactured by Advantec Toyo, model: A020A025A), and the alkali metal ion in the polymer powder (P1) was measured in 100 ml of the filtrate at the following conditions. In addition, the content of the alkali metal ions was determined by a total amount of Na ions and K ions.

Inductively Coupled Plasma (ICP) luminescent analysis device: IRIS "Intrepid II XSP", manufactured by Thermo Co.

Quantitative method: absolute calibration curve method, using the samples with known concentrations (0 ppm, 0.1 ppm, 1 ppm and 10 ppm)

Measurement wavelength: Na: 589.5 nm and K: 766.4 nm (6) Powder Disintegration Properties By diluting the polymer powder (P1) with ion exchanged water, the device for the particle size distribution measurement of laser diffractive/scattering (manufactured by Shimadzu Co., "SALD-7100") with supersonic irradiation (frequency of 42 kHz, power of 40 W, irradiation for 5 minutes) was used to measure the ratio by volume of the particles of 10 μm or less before and after supersonic irradiation.

(7) Gelling Temperature

A dynamic viscoelasticity measurement device (manufactured by UBM Co., "Rheosol G-3000", 40 mm for parallel plates in diameter, 0.4 mm for gap, 1 Hz for frequency, 1 degree for screw angle) was used to measure the temperature dependence of viscoelasticity of the epoxy resin composition at a temperature starting at 40° C. and ending at 200° C. at a heating-up rate of 4° C./min.

In addition, if a ratio of the storage elastic modulus G' to the loss elastic modulus G" (G"/G'=tan δ) was 20 or more at the start of measurement and then was lower than 20 at a certain temperature after heating up, occurrence of gelling was judged, with the temperature in case of tan δ=20 being set as the gelling temperature.

(8) Gelling Performance

For measurement of the gelling temperature of the epoxy resin composition, the storage elastic modulus G' at a gelling temperature of −20° C. was set as $G'_A$, the storage elastic modulus G' at a gelling temperature of +20° C. was set as $G'_B$ (arrival elastic modulus), and its ratio ($G'_B/G'_A$) was calculated for assessment of gelling performance by the following criteria.

⊚: $G'_B/G'_A$ of 100 or more
○: $G'_B/G'_A$ of 10 or more and less than 100
Δ: $G'_B/G'_A$ of 5 or more and less than 10
×: $G'_B/G'_A$ of less than 5

In case of $G'_B/G'_A$ of 10 or more, mobility of the curable resin may also be inhibited, even at high temperatures.

(9) Dispersity

A fineness gauge was used to measure a dispersed state of the polymer powder (P1) in the epoxy resin composition by JIS K-5600, and the dispersity was assessed by the following criteria.

○: 2 μm or less
Δ: more than 2 μm but not more than 10 μm

In case of 2 μm or less for the dispersed state of the polymer powder (P1) in the epoxy resin composition, it may be used for fine pitching or filming.

(10) Initial Viscosity

After preparation of the epoxy resin composition, its temperature was immediately adjusted to 25° C., and its viscosity was measured by the model BM viscosimeter (manufactured by TOKYO KEIKI Co., model B viscosimeter, rotor No. 4, rotation rate 60 rpm), as initial viscosity of the epoxy resin composition, and was assessed by the following criteria.

⊚: 30000 or less
○: more than 30000 but not more than 35000.
Δ: more than 35000 but not more than 40000.
×: more than 40000.

In case of the epoxy resin composition having initial viscosity of 35000 or less, high precision coating and patterning were achieved without compromising operation.

(11) Bending Modulus

The resulted shaping body was cut into test pieces of 3 mm×10 mm×60 mm, and was measured for its load at a temperature of 23 t by using a tensile and compression testing machine (Strograph T, manufactured by Toyo Seiki Seisakusho Co.) according to Japanese Industrial Standards (JIS) K 7171, and was assessed by the following criteria.

○: 2400 MPa or less
Δ: more than 2400 MPa but not more than 2500 MPa
×: more than 2500 MPa.

[Preparation of the Polymer Powder (P1-1) to the Polymer Powder (P1-10)

The polymer powder (P1-1) to the polymer powder (P1-10) were prepared by Embodiment 1 to Embodiment 6, and Comparative example 1 to Comparative example 4. The following raw materials were used in Embodiment 1 to Embodiment 6 and Comparative example 1 to Comparative example 4.

Methyl methacrylate: produced by Mitsubishi Rayon Co., trade name "Acryester M"

N-butyl methylacrylate: produced by Mitsubishi Rayon Co., trade name "Acryester B"

N-butyl acrylate: produced by Mitsubishi Chemical Co.

Allyl methacrylate: produced by Mitsubishi Rayon Co., trade name "Acryester A"

2-ethylhexyl acrylate: produced by Mitsubishi Chemical Co.

Methacrylic acid: produced by Mitsubishi Rayon Co., trade name "Acryester MAA"

N-octylthiol: produced by KATAYAMA CHEMICAL CO. (guaranteed reagent)

Ammonium persulfate: produced by Wako Pure Chemical Industries, Ltd.

2,2'-azodi[N-(2-carboxyethyl)-2-methylpropionamidine]: produced by Wako Pure Chemical Industries, Ltd., trade name "VA-057"

Ammonium di-(2-ethylhexyl)sulfosuccinate: produced by New Japan Chemical co., ltd., trade name "Rikasurf M-300"

Embodiment 1

Preparation of the Polymer Powder (P1-1)

In a separable flask equipped with a maximal blending agitator, a reflux condenser tube, a temperature control device, a dropping pump and a nitrogen inlet pipe, 78.00 parts of ion exchanged water, 2.83 parts of methyl methacrylate and 2.17 parts of n-butyl methylacrylate were charged, and stirred at 120 rpm with nitrogen bubbling for 30 minutes. Thereafter, it was heated up to 80° C. under nitrogen atmosphere, and a solution of 0.04 part of pre-prepared ammonium persulfate in 2.00 parts of ion exchanged water was charged and held for 60 minutes, to obtain the seed particles.

In the flask having the seed particles formed, a mixture resulted from emulsion treatment of 49.66 parts of 2-ethylhexyl acrylate and 0.34 part of allyl methacrylate, 0.10 part of 2,2'-azodi-[N-(2-carboxyethyl)-2-methylpropionamidine], 0.50 part of ammonium di-2-ethylhexylsulfosuccinate and 25.00 parts of ion exchanged water by a homogenizer (manufactured by IKA Co., "ULTRA-TURRAX T-25", 25000 rpm), was added in drops for 150 minutes, and held for 60 minutes, to terminate polymerization for the (meth)acrylate-based polymer (A1) (Stage 1). The glass transition temperature (Tg) of the (meth)acrylate-based polymer (A1), calculated by the Fox formula, was given in table 1-1.

Subsequently, a monomer mixture for polymerization in Stage 2, resulted from emulsion treatment of 45.15 parts of methyl methacrylate, 3.00 parts of n-butyl methylacrylate, 1.00 parts of n-butyl acrylate, 0.85 part of methacrylic acid, 0.50 part of ammonium di-(2-ethylhexyl)sulfosuccinate and 25.0 parts of ion exchanged water by a dispersion mixer, was added in drops for 150 minutes, and then held for 60 minutes, to obtain the polymer emulsion. The results from assessment of the volume average primary particle size of the resulted polymer were given in table 1-1.

A spray dryer (manufactured by OHKAWARA KAKOHKI CO., model L-8) was used to treat the resulted polymer emulsion by spray drying at the following conditions, to obtain the polymer powder (P1-1). The results from assessment of the acetone-soluble component, molecular weight of the acetone-soluble component (Mw, Mn), alkali metal ion content and powder disintegration properties of the resulted polymer powder (P1-1) were given in table 1-1.

[Treatment Conditions for Spray Drying]
Spray mode: rotating disc
Disc rotation rate: 25,000 rpm
Hot-blast temperature: inlet temperature: 150° C.
Outlet temperature: 65° C.

TABLE 1-1

|  |  |  | Embodiment 1 | Embodiment 2 | Embodiment 3 | Embodiment 4 | Embodiment 5 | Embodiment 6 |
|---|---|---|---|---|---|---|---|---|
| Polymer powder |  |  | P1-1 | P1-2 | P1-3 | P1-4 | P1-5 | P1-6 |
| Polymerization in Stage 1 (A) | Seed particles | Ion exchanged water (initial addition) | 78.00 | 78.00 | 78.00 | 78.00 | 78.00 | 78.00 |
|  |  | Monomer mixture MMA | 2.83 | 2.83 | 2.83 | 2.83 | 2.83 | 2.83 |
|  |  | n-BMA | 2.17 | 2.17 | 2.17 | 2.17 | 2.17 | 2.17 |
|  |  | n-BA |  |  |  |  |  |  |
|  |  | AMA |  |  |  |  |  |  |
|  |  | Ammonium persulfate | 0.04 | 0.04 | 0.04 | 0.04 | 0.04 | 0.04 |
|  |  | Ion exchanged water | 2.00 | 2.00 | 2.00 | 2.00 | 2.00 | 2.00 |
|  | Dropping polymerization | Monomer mixture 2-EHA | 49.66 | 49.66 |  | 69.52 | 59.59 | 39.73 |
|  |  | n-BA |  |  | 49.76 |  |  |  |
|  |  | AMA | 0.34 | 0.34 | 0.24 | 0.48 | 0.41 | 0.27 |
|  |  | MMA |  |  |  |  |  |  |
|  |  | nBMA |  |  |  |  |  |  |
|  |  | Emulsifying agent | 0.50 | 0.50 | 0.50 | 0.70 | 0.60 | 0.40 |
|  |  | VA-057 | 0.10 | 0.10 | 0.10 | 0.14 | 0.12 | 0.08 |
|  |  | Ion exchanged water | 25.00 | 25.00 | 25.00 | 35.00 | 30.00 | 20.00 |
|  | Dropping time |  | 150 | 150 | 150 | 210 | 180 | 120 |
|  | Glass transition temperature [° C.] |  | −43 | −43 | −47 | −45 | −44 | −41 |
| Polymerization in stage 2 (B) | Dropping polymerization | Monomer mixture MMA | 45.15 | 45.15 | 45.15 | 27.09 | 36.12 | 54.18 |
|  |  | n-BMA | 3.00 | 3.00 | 3.00 | 1.80 | 2.40 | 3.60 |
|  |  | n-BA | 1.00 | 1.00 | 1.00 | 0.60 | 0.80 | 1.20 |
|  |  | MAA | 0.85 | 0.85 | 0.85 | 0.51 | 0.68 | 1.02 |
|  |  | AMA |  |  |  |  |  |  |
|  |  | Chain transfer agent n-OM |  |  |  |  |  |  |
|  |  | Emulsifying agent | 0.50 | 0.50 | 0.50 | 0.30 | 0.40 | 0.60 |
|  |  | VA-057 |  | 0.10 |  |  |  |  |
|  |  | Ion exchanged water | 25.00 | 25.00 | 25.00 | 15.00 | 20.00 | 30.00 |
|  | Dropping time |  | 150 | 150 | 150 | 90 | 120 | 180 |
|  | Glass transition temperature [° C.] |  | 95 | 95 | 95 | 95 | 95 | 95 |
| Primary particle size | Volume average (Dv) [nm] |  | 670 | 671 | 672 | 683 | 673 | 646 |
|  | Number average (Dn) [nm] |  | 615 | 627 | 605 | 616 | 623 | 576 |
|  | Monodispersity (Dv/Dn) |  | 1.09 | 1.07 | 1.11 | 1.11 | 1.08 | 1.12 |
| Secondary particle size | Volume average (Dv) [μm] |  | 36 | 41 | 41 | 52 | 40 | 37 |
| Acetone-soluble component [%] |  |  | 18 | 24 | 16 | 13 | 15 | 24 |
| Molecular weight of acetone-soluble component (10k) | Mw |  | 58 | 19 | 35 | 23 | 35 | 54 |
|  | Mn |  | 14 | 6 | 4 | 2 | 3 | 6 |
| Alkali metal ion content [ppm] |  |  | <5 | <5 | <5 | <5 | <5 | <5 |
| Powder disintegration properties Proportion for 10 μm or less [vol %] | Before supersonic irradiation |  | 1 | 1 | 1 | 0 | 1 | 1 |
|  | After supersonic irradiation |  | 30 | 23 | 20 | 11 | 18 | 37 |

TABLE 1-2

|  |  |  | Comparative example 1 | Comparative example 2 | Comparative example 3 | Comparative example 4 |
|---|---|---|---|---|---|---|
| Polymer powder |  |  | P1-7 | P1-8 | P1-9 | P1-10 |
| Polymerization in Stage 1 (A) | Seed particles | Ion exchanged water (initial addition) | 78.00 | 78.00 | 92.43 | 78.00 |
|  |  | Monomer mixture MMA | 2.83 |  |  | 2.83 |
|  |  | n-BMA | 2.17 |  |  | 2.17 |
|  |  | n-BA |  | 4.88 | 5.00 |  |
|  |  | AMA |  | 0.12 | 0.13 |  |
|  |  | Ammonium persulfate | 0.04 | 0.04 | 0.02 | 0.04 |
|  |  | Ion exchanged water | 2.00 | 2.00 | 8.30 | 2.00 |
|  | Dropping polymerization | Monomer mixture 2-EHA |  |  | 85.00 | 49.66 |
|  |  | n-BA |  | 63.41 |  |  |
|  |  | AMA |  | 1.59 | 1.49 | 0.34 |
|  |  | MMA | 56.15 |  |  |  |
|  |  | nBMA | 8.85 |  |  |  |
|  |  | Emulsifying agent | 0.70 | 0.70 | 0.80 | 0.50 |
|  |  | VA-057 |  |  | 0.13 | 0.10 |
|  |  | Ion exchanged water | 35.00 | 35.00 | 41.70 | 25.00 |
|  | Dropping time |  | 210 | 210 | 270 | 150 |
|  | Glass transition temperature [° C.] |  | 88 | −54 | −50 | −43 |

TABLE 1-2-continued

|  |  |  |  | Comparative example 1 | Comparative example 2 | Comparative example 3 | Comparative example 4 |
|---|---|---|---|---|---|---|---|
| Polymerization in stage 2 (B) | Dropping polymerization | Monomer mixture | MMA | 29.24 | 29.40 | 9.80 | 45.05 |
|  |  |  | n-BMA |  |  |  | 3.00 |
|  |  |  | n-BA |  | 0.60 | 0.20 | 1.00 |
|  |  |  | MAA | 0.76 |  |  | 0.85 |
|  |  |  | AMA |  |  | 0.25 |  |
|  |  | Chain transfer agent | n-OM |  |  |  | 0.10 |
|  |  | Emulsifying agent |  | 0.30 | 0.30 | 0.20 | 0.50 |
|  |  | VA-057 |  |  |  | 0.05 |  |
|  |  | Ion exchanged water |  | 15.00 | 15.00 | 5.00 | 25.00 |
|  | Dropping time |  |  | 90 | 90 | 60 | 150 |
|  | Glass transition temperature [° C.] |  |  | 107 | 100 | 100 | 95 |
| Primary particle size | Volume average (Dv) [nm] |  |  | 670 | 620 | 635 | 683 |
|  | Number average (Dn) [nm] |  |  | 604 | 578 | 595 | 611 |
|  | Monodispersity (Dv/Dn) |  |  | 1.11 | 1.07 | 1.07 | 1.12 |
| Secondary particle size | Volume average (Dv) [μm] |  |  | 29 | 55 | 93 | 41 |
| Acetone-soluble component [%] |  |  |  | >98 | 1 | 1 | 44 |
| Molecular weight of acetone-soluble component (10k) |  | Mw |  | 78 | 36 | 2 | 8 |
|  |  | Mn |  | 28 | 9 | 1 | 4 |
| Alkali metal ion content [ppm] |  |  |  | <5 | <5 | <5 | <5 |
| Powder disintegration properties Proportion for 10 μm or less [vol %] | Before supersonic irradiation |  |  | 8 | 0 | 0 | 1 |
|  | After supersonic irradiation |  |  | 37 | 30 | 7 | 16 |

Acronyms in the tables represent the following compounds.

MMA: Methyl methacrylate
n-BMA: N-butyl methylacrylate
n-BA: N-butyl acrylate
AMA: Allyl methacrylate
2-EHA: 2-ethylhexyl acrylate
MAA: Methacrylic acid
n-OM: N-octylthiol
Emulsifying Agent Ammonium Di-(2-Ethylhexyl)Sulfosuccinate
VA-057: 2,2'-azodi-[N-(2-carboxylethyl)-2-methylpropionamidine]

Embodiment 2 to Embodiment 6, Comparative Example 1 to Comparative Example 4

Preparation of the Polymer Powder (P1-2) to the Polymer Powder (P1-10)

The polymer powder (P1-2) to the polymer powder (P1-10) were prepared in the same manner as in Embodiment 1, except for feed composition set as shown in table 1-1 and table 1-2, to obtain the polymer powder (P1-2) to the polymer powder (P1-10). The results from assessment of the volume average primary particle size of the resulted polymer were given in table 1-1 and table 1-2. The results from assessment of the acetone-soluble component, molecular weight of the acetone-soluble component (Mw, Mn), alkali metal ion content and powder disintegration properties of the resulted polymer powder (P1-2) to the polymer powder (P1-10), were given in table 1-1 and table 1-2.

Embodiment 7 to Embodiment 12, Comparative Example 5 to Comparative Example 8

The epoxy resin (trade name "JER828", produced by Mitsubishi Chemical Co.) and the polymer powder were formulated at the ratios as shown in table 2-1 and table 2-2, and were blended for 3 minutes in a planetary vacuum blender (manufactured by Thinky Co., trade name "ARV-310LED") at a rotation rate of 1200 rpm at atmospheric pressure, to obtain the blend. The resulted blends were treated once at roller spacing of 20 μm/10 μm, once at roller spacing of 10 μm/5 μm, and once at roller spacing of 5 μm/5 μm in a three-roll mill (manufactured by EXAKT Co., "M-80E") at a rotation rate of 200 rpm.

Thereafter, the planetary vacuum blender (manufactured by Thinky Co., trade name "ARV-310LED") was used again for blending/debubbling over 2 minutes at a rotation rate of 1200 rpm at a reduced pressure of 3 KPa, to obtain the epoxy resin composition. The resulted epoxy resin composition was assessed for its gelling temperature and gelling performance. The results from assessment were given in table 2-1 and table 2-2.

TABLE 2-1

|  |  | Embodiment 7 | Embodiment 8 | Embodiment 9 | Embodiment 10 | Embodiment 11 | Embodiment 12 |
|---|---|---|---|---|---|---|---|
| Epoxy resin (JER828) | Formulation (parts) | 100 | 100 | 100 | 100 | 100 | 100 |
| Polymer powder | Type | P1-1 | P1-2 | P1-3 | P1-4 | P1-5 | P1-6 |
|  | Formulation (parts) | 20 | 20 | 20 | 20 | 20 | 20 |

TABLE 2-1-continued

|  |  | Embodiment 7 | Embodiment 8 | Embodiment 9 | Embodiment 10 | Embodiment 11 | Embodiment 12 |
|---|---|---|---|---|---|---|---|
| Assessment of epoxy resin composition | Gelling temperature (° C.) | 90 | 88 | 90 | 88 | 92 | 91 |
|  | $G'_B/G'_A$ | 90 | 13 | 78 | 12 | 78 | 94 |

TABLE 2-2

|  |  | Comparative example 5 | Comparative example 6 | Comparative example 7 | Comparative example 8 |
|---|---|---|---|---|---|
| Epoxy resin (JER828) | Formulation (parts) | 100 | 100 | 100 | 100 |
| Polymer powder | Type | P1-7 | P1-8 | P1-9 | P1-10 |
|  | Formulation (parts) | 20 | 20 | 20 | 20 |
| Assessment of epoxy resin composition | Gelling temperature (° C.) | 90 | No gelling | No gelling | 90 |
|  | $G'_B/G'_A$ | >1000 | — | — | 1 |

Embodiment 13 to Embodiment 23, Comparative Example 9 to Comparative Example 14

The epoxy resin (trade name "JER828", produced by Mitsubishi Chemical Co.) and the polymer powder were formulated at the ratios as shown in table 3-1 and table 3-2, and were blended for 3 minutes in the planetary vacuum blender (manufactured by Thinky Co., trade name "ARV-310LED") at a rotation rate of 1200 rpm at atmospheric pressure, to obtain the blend. The resulted blends were treated once at roller spacing of 20 μm/10 μm, once at roller spacing of 10 μm/5 μm, and once at roller spacing of 5 μm/5 μm in the three-roll mill (manufactured by EXAKT Co., "M-80E") at a rotation rate of 200 rpm.

Thereafter, the planetary vacuum blender (manufactured by Thinky Co., trade name "ARV-310LED") was used again for blending/debubbling over 2 minutes at a rotation rate of 1200 rpm at a reduced pressure of 3 KPa, to obtain the epoxy resin composition. The resulted epoxy resin composition was assessed for its dispersity, initial viscosity, gelling temperature and gelling performance. The results from assessment were given in table 3-1 and table 3-2.

In the resulted epoxy resin composition, the anhydride-based curing agent (trade name "Rikacid MH-700", produced by New Japan Chemical Co., Ltd.) and 2-ethyl-4-methylimidazole as curing accelerant (produced by SHIKOKU CHEMICALS CORPORATION) were formulated at the ratios as shown in table 3-3 and table 3-4, and were blended/debubbled for 2 minutes in the planetary vacuum blender (manufactured by Thinky Co., trade name "ARV-310LED") at a rotation rate of 1200 rpm at a reduced pressure of 3 KPa, to obtain the epoxy resin composition. Subsequently, a polyethylene terephthalate (PET) film (produced by Toyobo Co., trade name: TN200) was applied on single side of each of the 2 reinforced glass boards of length 300 mm×width 300 mm×thickness 5 mm, with the PET films facing in opposite direction; and a spacer made from Teflon (registered trademark) with a thickness of 3 mm was sandwiched between the reinforced glass boards to obtain a mold. The epoxy resin composition was filled in the mold, fixed by a clamp and then precured for 3 hours at 100° C. prior to curing for 4 hours at 120° C., and was taken out of the mold to obtain the cured material with a thickness of 3 mm. The resulted cured material was annealed for 6 hours at 180° C. for assessment of bending modulus. The results from measurement were given in table 3-3 and table 3-4.

TABLE 3-1

|  |  |  | Embodiment 13 | Embodiment 14 | Embodiment 15 | Embodiment 16 | Embodiment 17 | Embodiment 18 | Embodiment 19 | Embodiment 20 | Embodiment 21 | Embodiment 22 | Embodiment 23 |
|---|---|---|---|---|---|---|---|---|---|---|---|---|---|
| Formulation (parts) | Epoxy resin | JER828 | 100 | 100 | 100 | 100 | 100 | 100 | 100 | 100 | 100 | 100 | 100 |
|  | Polymer powder | P1-1 | 36 | 25 | 18 |  |  |  |  |  |  |  |  |
|  |  | P1-2 |  |  |  | 36 | 25 | 18 |  |  |  |  |  |
|  |  | P1-3 |  |  |  |  |  |  | 25 |  |  |  |  |
|  |  | P1-4 |  |  |  |  |  |  |  | 26 | 26 |  |  |
|  |  | P1-5 |  |  |  |  |  |  |  |  |  | 30 |  |
|  |  | P1-6 |  |  |  |  |  |  |  |  |  |  | 23 |
|  |  | P1-7 |  |  |  |  |  |  |  |  | 2 |  |  |
|  |  | P1-8 |  |  |  |  |  |  |  |  |  |  |  |
|  |  | P1-9 |  | 6 | 10 |  | 6 | 10 | 6 |  |  |  | 10 |
|  |  | P1-10 |  |  |  |  |  |  |  |  |  |  |  |
| Assessment of epoxy resin composition | Dispersity |  | ○ | ○ | ○ | ○ | ○ | ○ | ○ | ○ | ○ | ○ | ○ |
|  | Initial viscosity | Initial [mPa·s] | 34500 | 34100 | 28900 | 34600 | 34400 | 32700 | 36000 | 19800 | 25200 | 29600 | 35800 |
|  |  | Assessment | ○ | ○ | ◎ | ○ | ○ | ○ | Δ | ◎ | ◎ | ◎ | Δ |

TABLE 3-1-continued

|  |  | Embodiment 13 | Embodiment 14 | Embodiment 15 | Embodiment 16 | Embodiment 17 | Embodiment 18 | Embodiment 19 | Embodiment 20 | Embodiment 21 | Embodiment 22 | Embodiment 23 |
|---|---|---|---|---|---|---|---|---|---|---|---|---|
| Assessment of gelling property | Gelling temperature [° C.] | 86 | 86 | 91 | 90 | 88 | 90 | 87 | 86 | 100 | 90 | 89 |
|  | Gelling performance | ◉ | ◉ | ○ | ○ | ○ | Δ | ○ | Δ | ○ | ◉ | ○ |

TABLE 3-2

|  |  |  | Comparative example 9 | Comparative example 10 | Comparative example 11 | Comparative example 12 | Comparative example 13 | Comparative example 14 |
|---|---|---|---|---|---|---|---|---|
| Formulation (parts) | Epoxy resin | JER828 | 100 | 100 | 100 | 100 | 100 | 100 |
|  | Polymer powder | P1-1 |  |  |  |  |  |  |
|  |  | P1-2 |  |  |  |  |  |  |
|  |  | P1-3 |  |  |  |  |  |  |
|  |  | P1-4 |  |  |  |  |  |  |
|  |  | P1-5 |  |  |  |  |  |  |
|  |  | P1-6 |  |  |  |  |  |  |
|  |  | P1-7 |  | 10 |  |  | 10 |  |
|  |  | P1-8 |  |  | 26 |  |  |  |
|  |  | P1-9 |  |  |  | 20 | 20 |  |
|  |  | P1-10 |  |  |  |  |  | 36 |
| Assessment of epoxy resin composition | Dispersity |  | — | ○ | ○ | Δ | ○ | ○ |
|  | Initial viscosity | Initial viscosity [mPa · s] | 15000 | 21000 | 37400 | 36200 | 41000 | 44500 |
|  |  | Assessment | ◉ | ◉ | Δ | Δ | X | X |
|  | Assessment of gelling property | Gelling temperature [° C.] | No gelling | 94 | No gelling | No gelling | 91 | 88 |
|  |  | Gelling performance | — | ◉ | — | — | ◉ | X |

TABLE 3-3

|  |  |  | Embodiment 13 | Embodiment 14 | Embodiment 15 | Embodiment 16 | Embodiment 17 | Embodiment 18 | Embodiment 19 | Embodiment 20 | Embodiment 21 | Embodiment 22 | Embodiment 23 |
|---|---|---|---|---|---|---|---|---|---|---|---|---|
| Formulation (parts) | Epoxy resin | JER828 | 100 | 100 | 100 | 100 | 100 | 100 | 100 | 100 | 100 | 100 | 100 |
|  | Polymer powder | P1-1 | 36 | 25 | 18 |  |  |  |  |  |  |  |  |
|  |  | P1-2 |  |  |  | 36 | 25 | 18 |  |  |  |  |  |
|  |  | P1-3 |  |  |  |  |  |  | 25 |  |  |  |  |
|  |  | P1-4 |  |  |  |  |  |  |  | 26 | 26 |  |  |
|  |  | P1-5 |  |  |  |  |  |  |  |  |  | 30 |  |
|  |  | P1-6 |  |  |  |  |  |  |  |  |  |  | 23 |
|  |  | P1-7 |  |  |  |  |  |  |  |  | 2 |  |  |
|  |  | P1-8 |  |  |  |  |  |  |  |  |  |  |  |
|  |  | P1-9 |  | 6 | 10 |  | 6 | 10 | 6 |  |  |  | 10 |
|  |  | P1-10 |  |  |  |  |  |  |  |  |  |  |  |
|  | Curing agent |  | 85 | 85 | 85 | 85 | 85 | 85 | 85 | 85 | 85 | 85 | 85 |
|  | Curing accelerant |  | 1 | 1 | 1 | 1 | 1 | 1 | 1 | 1 | 1 | 1 | 1 |
| Assessment of the cured material | Bending modulus | Bending modulus [Mpa] | 2350 | 2360 | 2370 | 2360 | 2350 | 2380 | 2410 | 2380 | 2390 | 2370 | 2390 |
|  |  | Assessment | ○ | ○ | ○ | ○ | ○ | ○ | Δ | ○ | ○ | ○ | ○ |

TABLE 3-4

|  |  |  | Comparative example 9 | Comparative example 10 | Comparative example 11 | Comparative example 12 | Comparative example 13 | Comparative example 14 |
|---|---|---|---|---|---|---|---|---|
| Formulation (parts) | Epoxy resin | JER828 | 100 | 100 | 100 | 100 | 100 | 100 |
|  | Polymer powder | P1-1 |  |  |  |  |  |  |
|  |  | P1-2 |  |  |  |  |  |  |
|  |  | P1-3 |  |  |  |  |  |  |
|  |  | P1-4 |  |  |  |  |  |  |
|  |  | P1-5 |  |  |  |  |  |  |
|  |  | P1-6 |  |  |  |  |  |  |
|  |  | P1-7 |  | 10 |  |  | 10 |  |
|  |  | P1-8 |  |  | 26 |  |  |  |
|  |  | P1-9 |  |  |  | 20 | 20 | 6 |
|  |  | P1-10 |  |  |  |  |  | 25 |
|  | Curing agent |  | 85 | 85 | 85 | 85 | 85 | 85 |
|  | Curing accelerant |  | 1 | 1 | 1 | 1 | 1 | 1 |
| Assessment of the cured material | Bending modulus | Bending modulus [Mpa] | 2980 | 2940 | 2460 | 2380 | 2390 | 2470 |
|  |  | Assessment | X | X | Δ | ○ | ○ | Δ |

As shown in table 2-1 and table 2-2, the epoxy resin compositions in Embodiment 7 to Embodiment 12 added with the polymer powder (P1-1) to the polymer powder (P1-6) of the present invention have excellent gelling properties. The epoxy resin compositions in Comparative example 6 to Comparative example 8, added with the polymer powder (P1-8) (acetone-soluble component being below the range of the present invention), polymer powder (P1-9) (acetone-soluble component having the mass average molecular weight below the range of the present invention), polymer powder (P1-10) (acetone-soluble component having the mass average molecular weight below the range of the present invention), have lower gelling properties.

As shown in table 3-1 to table 3-4, Embodiment 13, Embodiment 16, Embodiment 20 and Embodiment 22 added with the polymer powder (P1-1), polymer powder (P1-2), polymer powder (P1-4) and polymer powder (P1-5) of the present invention are excellent in equilibrium of initial viscosity, gelling properties, and elastic modulus-lowering effect of the cured material.

In terms of target gelling properties and elastic modulus, the pre-gelling agent and stress relaxation agent were used, in addition to the polymer powder (P1) of the present invention, and thereby it is further expected to have improvement in equilibrium of initial viscosity, gelling property and elastic modulus-lowering effect of the cured material.

The epoxy resin compositions in Embodiment 14 and Embodiment 15 having the polymer powder (P1-1) of the present invention in combination with the polymer powder (P1-9) having excellent stress relaxation ability (acetone-soluble component and its mass average molecular weight outside the range of the present invention) have excellence in equilibrium of initial viscosity, gelling properties and elastic modulus-lowering effect of the cured material. Especially for the epoxy resin composition in Embodiment 15, due to low initial viscosity, it is expected for improved operation, high precision coating and patterning.

The acetone-soluble components in the polymer powder (P1-1) and polymer powder (P1-2) have different molecular weights. By respective comparison between Embodiment 13 and Embodiment 16, Embodiment 14 and Embodiment 17, Embodiment 15 and Embodiment 18, Embodiment 13 to Embodiment 15 added with the polymer powder (P1-1) have excellent gelling performance. It is seen that the molecular weight of the acetone-soluble component has significant effect on gelling performance.

In the polymer powder (P1-3), the (meth)acrylate-based polymer (A1) is formed from the n-butyl acrylate units set to be 50 mass % or more. By comparison between Embodiment 19 added with the polymer powder (P1-3) and Embodiment 14 added with the polymer powder (P1-1) ((meth)acrylate-based polymer (A1) having 2-ethylhexyl acrylate units set to be 50 mass % or more), the cured material in case of the epoxy resin composition in Embodiment 14 has higher elastic modulus-lowering effect. It is seen that in case of (meth)acrylate-based polymer having 2-ethylhexyl acrylate units set to be 50 mass % or more, the cured material has more excellent elastic modulus-lowering effect.

Embodiment 20, Embodiment 22 and Embodiment 23 were the epoxy resin compositions added with the polymer powder (P1-4), polymer powder (P1-5) and polymer powder (P1-6) having varied ratios of the (meth)acrylate-based polymer (A1) to the polymer (B1). It is seen from the result that, Embodiment 10 including more (meth)acrylate-based polymer (A1) has excellent effect in initial viscosity lowering. It is further seen that, in Embodiment 21 with a combination of the polymer powder (P1-4) with the polymer powder (P1-7) having excellent gelling property, it is more excellent in equilibrium of initial viscosity, gelling property and elastic modulus-lowering effect.

It is seen that, in case of using only the polymer powder (P1-6) including less (meth)acrylate-based polymer (A1), the cured material has low elastic modulus-lowering effect, and in case of using in combination with the polymer powder (P1-9) having excellent stress relaxation (outside the range of the present invention) (Embodiment 23) will provide excellent equilibrium of initial viscosity, gelling property and elastic modulus-lowering effect.

Gelling properties were not found in the epoxy resin composition in Comparative example 9 without addition of the polymer powder of the present invention, resulting in high elastic modulus for the resulted cured material.

For the epoxy resin composition in Comparative example 10 added with the polymer powder (P1-7) of the (meth)acrylate-based polymer (A1) having the glass transition temperature of higher than 0° C., the elastic modulus-lowering effect was not found in its cured material, although presence of high gelling performance.

Gelling properties were not found in the epoxy resin composition in Comparative example 11 added with the polymer powder (P1-8) including less acetone-soluble component, resulting in low elastic modulus-lowering effect for the resulted cured material.

Gelling properties were not found in the epoxy resin composition in Comparative example 12 added with the polymer powder (P1-9) including less acetone-soluble component with low mass average molecular weight.

For the epoxy resin composition in Comparative example 13 added with the polymer powder (P1-7) and the polymer powder (P1-9), it had significantly increased initial viscosity, incompetent for high precision coating and patterning, although presence of high gelling performance and elastic modulus-lowering effect.

The epoxy resin composition in Comparative example 14 added with the polymer powder (P1-10)) including the acetone-soluble component with the low molecular weight had high initial viscosity and also low gelling property.

<Preparation and Assessment of the Polymer Powder (P2)>

(1) Primary Particle Size and Monodispersity

The device for the particle size distribution measurement of diffractive/scattering (produced by Shimadzu Corporation, "SALD-7100") was used to measure the volume average primary particle size (Dv) and number average primary particle size (Dn) by diluting the polymer emulsion with ion exchanged water.

The refractivity is calculated by composition of the monomer added. In case of multilayer structures such as core-shell structure, the refractivity was calculated for each of the layers respectively, and overall average was calculated from the mass ratios of each layer.

The median values were used for average size. In addition, the monodispersity (Dv/Dn) was calculated by values of Dv and Dn. Monodispersity was assessed by the following criteria.

The sample concentration of the vinyl polymer emulsion was appropriately adjusted within the suitable range in a monitor for scattered light strength in the apparatus.

(2) Acetone-Soluble Component 1 g of the polymer powder (P2) was dissolved into 50 g of acetone, refluxed for 6 hours at 70° C. and extracted, and then was centrifugalized for 30 minutes by the centrifuging device (manufactured by Hitachi Co., "CRG SERIES") at 14,000 rpm at 4° C. The separated acetone-soluble component was removed by decantation, and the acetone-insoluble component was dried for 24 hours in the vacuum drier at 50° C. prior to the measurement of mass. The acetone-soluble component (mass %) is calculated by the following formula.

(Acetone-soluble component)=(1−the mass of acetone-insoluble component by mass)×100

(3) Molecular Weight of the Acetone-Soluble Component

Acetone was removed by distillation, from the acetone-soluble component resulted from measurement of the acetone-soluble component, to obtain the solids content in the acetone-soluble component. The gel permeation chromatograph was used to measure the mass average molecular weight (Mw) of the solids content at the following conditions. In addition, the number average molecular weight (Mn) was also measured.

Device: HLC8220, manufactured by Tosoh Corp.
Column: TSKgel SuperHZM-M (inner diameter 4.6 mm×length 15 cm); number of columns: 4; exclusion limit: $4 \times 10^6$
Temperature: 40° C.
Carrier: tetrahydrofuran
Flow rate: 0.35 ml/min
Sample concentration: 0.1 mass %
Sample load: 10 μl
Standard: polystyrene (4) Content of Alkali Metal Ion 20 g of the polymer powder (P2) was weighed into a glass-made pressure vessel, and 200 ml of ion exchanged water was added with the measuring cylinder prior to capping and vigorous shaking and mixing for its uniform dispersion, to obtain the vinyl polymer dispersion. Thereafter, the resulted dispersion was placed into the gear oven at 95° C. for 20 hours, for extraction of the ionic component in the polymer powder (P1).

Subsequently, the glass vessel was taken out of the oven and cooled, and the dispersion was filtered by 0.2 μm cellulose mixed ester-made film filter (manufactured by Advantec Toyo, model: A020A025A), and the alkali metal ion in the polymer powder was measured in 100 ml of the filtrate at the following conditions. In addition, the content of the alkali metal ions was determined by a total amount of Na ions and K ions.

ICP luminescent analysis device: IRIS "Intrepid II XSP", manufactured by Thermo Co.
Quantitative method: absolute calibration curve method, using the samples with known concentrations (0 ppm, 0.1 ppm, 1 ppm and 10 ppm)
Measurement wavelength: Na: 589.5 nm and K: 766.4 nm (5) Powder Disintegration Properties By diluting the polymer powder (P1) with ion exchanged water, the device for the particle size distribution measurement of laser diffractive/scattering (manufactured by Shimadzu Co., "SALD-7100") was used to measure the ratio by volume of the particles of 10 μm or less before and after supersonic irradiation (frequency of 42 kHz, power of 40 W, irradiation for 3 minutes).

(6) Dispersity

The fineness gauge was used to measure the dispersed state of the polymer powder (P2) in the epoxy resin composition by JIS K-5600, and the dispersity was assessed by the following criteria.

○: 5 μm or less
Δ: more than 5 μm

In case of 5 μm or less for the dispersed state of the polymer powder (P2) in the epoxy resin composition, it may be used for fine pitching or filming.

(7) Gelling Temperature

The dynamic viscoelasticity measurement device (manufactured by UBM Co., "Rheosol G-3000", 40 mm for parallel plates in diameter, 0.4 mm for gap, 1 Hz for frequency, 1 degree for screw angle) was used to measure the temperature dependence of viscoelasticity of the resulted epoxy resin composition at a temperature starting at 40° C. and ending at 200° C. at a heating-up rate of 4° C./min.

In addition, if a ratio of the storage elastic modulus G' to the loss elastic modulus G" (G"/G'=tan δ) was 10 or more at the start of measurement and then was lower than 10 at a certain temperature after heating up, occurrence of gelling was judged, with the temperature in case of tan δ=20 being set as the gelling temperature.

(8) Gelling Performance

For measurement of the gelling temperature of the epoxy resin composition, the storage elastic modulus G' at a gelling temperature of −20° C. was set as G'A, the storage elastic modulus G' at a gelling temperature of +20° C. was set as GB (arrival elastic modulus), and its ratio was calculated for assessment of gelling performance by the following criteria.

○: G'B/G'A of 100 or more
x: G'B/G'A of less than 100

In case of G'B/G'A of 100 or more, mobility of the epoxy resin composition may also be inhibited, even at high temperatures.

(9) Appearance

For the cured material with a thickness of 3 mm, obtained by curing the epoxy resin composition, its appearance was assessed by the following criteria.
 ○: no coagulum (granule), by visual examination
 Δ: coagulum (granule), by visual examination

(10) Total Light Transmittance

The epoxy resin cured material obtained by curing the epoxy resin composition was cut into test pieces of 3 mm×30 mm×30 mm, and a Haze Meter (manufactured by MURAKAMI COLOR RESEARCH LABORATORY, "HR-100") was used to measure the total light transmittance of the cured material at 23° C. and 120° C., and assessment was carried out by the following criteria.

In addition, the test piece heated for 30 minutes in the oven at 120° C. was used for assessment of the total light transmittance at 120° C.
 ○: total light transmittance of 80% or more
 Δ: total light transmittance of 50% or more and less than 80%
 x: total light transmittance of less than 50%

(11) Glass Transition Temperature

The epoxy resin cured material obtained by curing the epoxy resin composition was cut into test pieces of 3 mm×10 mm×60 mm, and its tan δ curve was measured by a device for dynamic analysis of mechanical property (model name "EXSTAR DMS6100", manufactured by Seiko Instruments) in a mode of bending by gripping at both ends, at a heating-up rate of 2° C./min, at a frequency of 10 Hz, with the temperature corresponding to a transition point as the glass transition temperature.

(12) Relative Dielectric Constant

The epoxy resin cured material obtained by curing the epoxy resin composition was cut into test pieces of 3 mm×30 mm×30 mm, and an impedance analyzer (model name "E4991A", manufactured by Agilent Technologies Co.) was used to measure the relative dielectric constant at a frequency of 100 MHz. The lower the relative dielectric constant value, the higher the insulatibility.

[Preparation of Polymer Powder (P2-1) to Polymer Powder (P2-10), Polymer Powder (P2'-1)]

The polymer powder (P2-1) to the polymer powder (P2-10) and (P2'-1) were prepared in Embodiment 31 to Embodiment 40 and Comparative example 31. The following raw materials were used in Embodiment 31 to Embodiment 40 and Comparative example 31.

Methyl methacrylate: produced by Mitsubishi Rayon Co., trade name "Acryester M"

N-butyl methylacrylate: produced by Mitsubishi Rayon Co., trade name "Acryester B"

N-butyl acrylate: produced by Mitsubishi Chemical Co.

Styrene: produced by Nippon Steel Chemical Co., Ltd.

Divinylbenzene: produced by Nippon Steel Chemical Co., Ltd.

Methacrylic acid: produced by Mitsubishi Rayon Co., trade name "Acryester MAA"

2-hydroxyethyl methacrylate: produced by Mitsubishi Rayon Co., trade name "Acryester HO"

Allyl methacrylate: produced by Mitsubishi Rayon Co., trade name "Acryester A"

Ammonium di-(2-ethylhexyl)sulfosuccinate: produced by Toho Chemical Industry Co., ltd., trade name "Rikasurf M-300"

Ammonium persulfate: produced by Wako Pure Chemical Industries, Ltd.

Potassium persulfate: produced by Wako Pure Chemical Industries, Ltd.

2,2'-azodi[2,4-dimethylvaleronitrile]: produced by Wako Pure Chemical Industries, Ltd., trade name "V-65" (temperature of 51° C. for half life of 10 hours)

Embodiment 31

Preparation of the Polymer Powder (P2-1)

In the separable flask equipped with the maximal blending agitator, the reflux condenser tube, the temperature control device, the dropping pump and the nitrogen inlet pipe, 78.00 parts by mass of ion exchanged water, 2.83 parts by mass of methyl methacrylate and 2.17 parts by mass of n-butyl methylacrylate were charged, and stirred at 120 rpm with nitrogen bubbling for 30 minutes.

Thereafter, it was heated up to 80° C. under nitrogen atmosphere, and a solution of 0.02 part by mass of pre-prepared ammonium persulfate in 2.00 parts by mass of ion exchanged water was charged and held for 60 minutes, to obtain the seed particles.

In the flask having the seed particles formed, the mixture resulted from emulsion treatment of 92.94 parts by mass of methyl methacrylate, 2.00 parts by mass of n-butyl methylacrylate, 0.06 part by mass of allyl methylacrylate, 1.00 parts by mass of ammonium di-2-ethylhexylsulfosuccinate, 0.02 part by mass of 2,2'-azodi(2,4-dimethylvaleronitrile) and 50.00 parts by mass of ion exchanged water by the homogenizer (manufactured by IKA Co., "ULTRA-TURRAX T-25", 25000 rpm) was added in drops for 300 minutes, and then held for 1 hour prior to the termination of polymerization. The results from assessment of the primary particle size of the resulted vinyl polymer emulsion were given in table 4-1.

The L-8i spray dryer (manufactured by OHKAWARA KAKOHKI CO.) was used to treat the resulted vinyl polymer emulsion by spray drying at the following conditions, to obtain the polymer powder (P2-1). The results from assessment of the acetone-soluble component, molecular weight of the acetone-soluble component (Mw, Mn), alkali metal ion content and powder disintegration properties of the resulted polymer powder (P2-1) were given in table 4-1.

[Treatment Conditions for Spray Drying]
Spray mode: rotating disc
Disc rotation rate: 25,000 rpm
Hot-blast temperature
Inlet temperature: 150° C.
Outlet temperature: 65° C.

Embodiment 32 to Embodiment 40 and Comparative Example 31

Preparation of Polymer Powder (P2-2) to Polymer Powder (P2-10), Polymer Powder (P2'-1)

In Embodiment 32 to Embodiment 40 and Comparative example 31, the polymer powder (P2-2) to the polymer powder (P2-10) and the polymer powder (P2'-1) were prepared in the same manner as in Embodiment 31, except for feed composition and polymerization conditions set as shown in table 4-1 and table 4-2. The results from assessment of primary particle size of the resulted vinyl polymer emulsion were given in table 4-1 and table 4-2. The results from assessment of the acetone-soluble component, molecular weight of the acetone-soluble component (Mw, Mn), alkali metal ion content and powder disintegration properties of the resulted polymer powder (P2-2) to the polymer powder (P2-10), and the polymer powder (P2'-1) were given in table 4-1 and table 4-2.

Comparative Example 32

Preparation of Polymer Powder (P2'-2)

In the separable flask equipped with the maximal blending agitator, the reflux condenser tube, the temperature control device, the dropping pump and the nitrogen inlet pipe, 157.57 parts by mass of ion exchanged water, 3.05 parts by mass of n-butyl acrylate, 0.83 part by mass of styrene, 0.13 part by mass of divinylbenzene and 0.20 part by mass of ammonium di-2-ethylhexyl sulfosuccinate were charged, and stirred at 120 rpm with nitrogen bubbling for 30 minutes.

Thereafter, it was heated up to 80° C. under nitrogen atmosphere, and a solution of 0.01 part by mass of pre-prepared potassium persulfate in 3.22 parts by mass of ion exchanged water was charged and held for 60 minutes, to obtain the seed particles.

In the flask having the seed particles formed, 0.06 part of potassium persulfate was added, and a monomer mixture including 58.04 parts by mass of n-butyl acrylate, 15.72 parts by mass of styrene, 2.36 parts by mass of divinylbenzene and 0.31 part by mass of ammonium di-2-ethylhexylsulfosuccinate was added in drops for 120 minutes, and held for 1 hour, prior to termination of polymerization in Stage 1.

Furthermore, 0.02 part by mass of potassium persulfate was added, and a monomer mixture including 19.29 parts by mass of methyl methacrylate, 0.48 part by mass of methacrylic acid, 0.10 part by mass of allyl methacrylate and 0.10 part by mass of ammonium di-2-ethylhexylsulfosuccinate was added in drops for 30 minutes, and held for 1 hour, prior to the termination of polymerization. The results from assessment of the primary particle size of the resulted vinyl polymer emulsion were given in table 4-2.

The resulted vinyl polymer emulsion was treated by spray drying, in the same manner as in Embodiment 31, to obtain the polymer powder (P2'-2). The results from assessment of the acetone-soluble component, molecular weight of the acetone-soluble component (Mw, Mn), alkali metal ion contents and powder disintegration properties of the resulted polymer powder (P2'-2) were given in table 4-2.

TABLE 4-1

| | | | | Embodiment 31 | Embodiment 32 | Embodiment 33 | Embodiment 34 | Embodiment 35 | Embodiment 36 | Embodiment 37 |
|---|---|---|---|---|---|---|---|---|---|---|
| | Composition | | | P2-1 | P2-2 | P2-3 | P2-4 | P2-5 | P2-6 | P2-7 |
| Polymerization in Stage 1 | Seed particles | Ion exchanged water (initial addition) | | 78.00 | 78.00 | 78.00 | 78.00 | 78.00 | 78.00 | 78.00 |
| | | Monomer mixture | MMA | 2.83 | 2.83 | 2.83 | 2.83 | 2.83 | 2.83 | 2.83 |
| | | | n-BMA | 2.17 | 2.17 | 2.17 | 2.17 | 2.17 | 2.17 | 2.17 |
| | | | n-BA | — | — | — | — | — | — | — |
| | | | St | — | — | — | — | — | — | — |
| | | | DVB | — | — | — | — | — | — | — |
| | | Emulsifying agent | | — | — | — | — | — | — | — |
| | | Ammonium persulfate | | 0.02 | 0.02 | 0.02 | 0.04 | 0.04 | 0.04 | 0.04 |
| | | Potassium persulfate | | — | — | — | — | — | — | — |
| | | Ion exchanged water | | 2.00 | 2.00 | 2.00 | 2.00 | 2.00 | 2.00 | 2.00 |
| | Dropping polymerization | Potassium persulfate | | — | — | — | — | — | — | — |
| | | Monomer mixture | MMA | 92.94 | 85.94 | 81.94 | 77.94 | 84.90 | 84.92 | 84.94 |
| | | | n-BMA | 2.00 | 5.00 | 5.00 | 7.00 | 4.00 | 4.00 | 4.00 |
| | | | n-BA | — | — | — | — | — | — | — |
| | | | St | — | — | — | — | — | — | — |
| | | | MAA | — | 4.00 | 8.00 | 10.0 | — | — | — |
| | | | HEMA | — | — | — | — | 6.00 | 6.00 | 6.00 |
| | | | AMA | 0.06 | 0.06 | 0.06 | 0.06 | 0.10 | 0.08 | 0.06 |
| | | | DVB | — | — | — | — | — | — | — |
| | | Emulsifying agent | | 1.00 | 1.00 | 1.00 | 1.00 | 1.00 | 1.00 | 1.00 |
| | | V-65 | | 0.02 | 0.02 | 0.02 | — | 0.02 | 0.02 | 0.02 |
| | | Ion exchanged water | | 50.00 | 50.00 | 50.00 | 50.00 | 50.00 | 50.00 | 50.00 |
| | | Dropping time | | 300 | 300 | 300 | 300 | 300 | 300 | 300 |
| | | Refractivity | | 1.49 | 1.49 | 1.49 | 1.49 | 1.49 | 1.49 | 1.49 |
| | | Glass transition temperature (° C.) | | 100 | 101 | 109 | 109 | 97 | 97 | 97 |
| Polymerization in Stage 2 | Dropping polymerization | Potassium persulfate | | | | | | | | |
| | | Monomer mixture | MMA | | | | | | | |
| | | | MAA | | | | | | | |
| | | | AMA | | | | | | | |
| | | Emulsifying agent | | | | | | | | |
| | | Ion exchanged water | | | | | | | | |
| | | Dropping time | | | | | | | | |
| | | Refractivity | | | | | | | | |
| | | Glass transition temperature (° C.) | | | | | | | | |
| Primary particle size | Volume average [Dv] (nm) | | | 632 | 608 | 604 | 605 | 609 | 630 | 594 |
| | Number average [Dn] (nm) | | | 570 | 557 | 555 | 555 | 558 | 568 | 548 |
| | Monodispersity (Dv/Dn) | | | 1.11 | 1.09 | 1.09 | 1.09 | 1.09 | 1.11 | 1.08 |
| Acetone-soluble component (%) | | | | 10 | 13 | 10 | 23 | 4 | 9 | 22 |
| Molecular weight of acetone-soluble component (10k) | | Mw | | 45 | 45 | 45 | 46 | 27 | 37 | 43 |
| | | Mn | | 19 | 19 | 18 | 17 | 10 | 12 | 13 |
| Alkali metal ion content (ppm) | | | | <1 | <1 | <1 | <1 | <1 | <1 | <1 |
| Powder disintegration properties | Before supersonic irradiation | | | 16 | 13 | 15 | 15 | 10 | 8 | 5 |

TABLE 4-1-continued

|  |  | Embodiment 31 | Embodiment 32 | Embodiment 33 | Embodiment 34 | Embodiment 35 | Embodiment 36 | Embodiment 37 |
|---|---|---|---|---|---|---|---|---|
| Proportion for 10 μm or less [vol %] | After supersonic irradiation | 32 | 35 | 38 | 39 | 35 | 54 | 31 |

TABLE 4-2

|  |  |  |  | Embodiment 38 | Embodiment 39 | Embodiment 40 | Comparative example 31 | Comparative example 32 |
|---|---|---|---|---|---|---|---|---|
|  |  | Composition |  | P2-8 | P2-9 | P2-10 | P2'-1 | P2'-2 |
| Polymerization on Stage 1 | Seed particles | Ion exchanged water (initial addition) |  | 78.00 | 78.00 | 78.00 | 78.00 | 157.57 |
|  |  | Monomer mixture | MMA | 2.83 | 2.83 | 2.83 | 2.83 | — |
|  |  |  | n-BMA | 2.17 | 2.17 | 2.17 | 2.17 | — |
|  |  |  | n-BA | — | — | — | — | 3.05 |
|  |  |  | St | — | — | — | — | 0.83 |
|  |  |  | DVB | — | — | — | — | 0.13 |
|  |  | Emulsifying agent |  | — | — | — | — | 0.20 |
|  |  | Ammonium persulfate |  | 0.04 | 0.04 | 0.04 | 0.02 | — |
|  |  | Potassium persulfate |  | — | — | — | — | 0.01 |
|  |  | Ion exchanged water |  | 2.00 | 2.00 | 2.00 | 2.00 | 3.22 |
|  | Dropping polymerization | Potassium persulfate |  | — | — | — | — | 0.06 |
|  |  | Monomer mixture | MMA | 78.80 | 75.80 | 74.10 | 78.00 | — |
|  |  |  | n-BMA | 5.00 | 5.00 | 5.00 | 5.50 | — |
|  |  |  | n-BA | — | — | — | 1.50 | 58.04 |
|  |  |  | St | 11.00 | 10.00 | 9.70 | — | 15.72 |
|  |  |  | MAA | — | 4.00 | — | 10.00 | — |
|  |  |  | HEMA | — | — | 6.00 | — | — |
|  |  |  | AMA | 0.20 | 0.20 | 0.20 | — | — |
|  |  |  | DVB | — | — | — | — | 2.36 |
|  |  | Emulsifying agent |  | 1.00 | 1.00 | 1.00 | 1.00 | 0.31 |
|  |  | V-65 |  | 0.02 | 0.02 | 0.02 | 0.02 | — |
|  |  | Ion exchanged water |  | 50.00 | 50.00 | 50.00 | 50.00 | — |
|  |  | Dropping time |  | 300 | 300 | 300 | 300 | 120 |
|  |  | Refractivity |  | 1.50 | 1.50 | 1.50 | 1.49 | 1.50 |
|  |  | Glass transition temperature (° C.) |  | 97 | 100 | 96 | 102 | −33 |
| Polymerization in Stage 2 | Dropping polymerization | Potassium persulfate |  |  |  |  |  | 0.02 |
|  |  | Monomer mixture | MMA |  |  |  |  | 19.29 |
|  |  |  | MAA |  |  |  |  | 0.48 |
|  |  |  | AMA |  |  |  |  | 0.10 |
|  |  | Emulsifying agent |  |  |  |  |  | 0.10 |
|  |  | Ion exchanged water |  |  |  |  |  | — |
|  |  | Dropping time |  |  |  |  |  | 30 |
|  |  | Refractivity |  |  |  |  |  | 1.49 |
|  |  | Glass transition temperature (° C.) |  |  |  |  | 107 |  |
| Primary particle size | Volume average [Dv] (nm) |  |  | 619 | 633 | 609 | 614 | 215 |
|  | Number average [Dn] (nm) |  |  | 563 | 570 | 558 | 560 | 196 |
|  | Monodispersity (Dv/Dn) |  |  | 1.10 | 1.11 | 1.09 | 1.10 | 1.10 |
|  | Acetone-soluble component (%) |  |  | 12 | 13 | 5 | >99 | 1 |
| Molecular weight of the acetone-soluble component (10k) | Mw |  |  | 25 | 37 | 17 | 136 | 3 |
|  | Mn |  |  | 10 | 12 | 7 | 46 | 2 |
|  | Alkali metal ion content (ppm) |  |  | <1 | <1 | <1 | <1 | 95 |
| Powder disintegration properties | Before supersonic irradiation |  |  | 7 | 5 | 4 | 11 | 3 |
| Proportion for 10 μm or less [vol %] | After supersonic irradiation |  |  | 63 | 39 | 43 | 33 | 3 |

Acronyms in the tables represent the following compounds.

MMA: methyl methacrylate
n-BMA: n-butyl methylacrylate
n-BA: n-butyl acrylate
St: Styrene
DVB: Divinylbenzene
AMA: Allyl methacrylate
MAA: Methacrylic acid
HEMA: 2-hydroxyethyl methacrylate
Emulsifying agent ammonium di-2-ethylhexylsulfosuccinate
V-65: 2,2'-azodi(2,4-dimethylvaleronitrile)

Embodiment 41 to Embodiment 50, Comparative Example 33 to Comparative Example 35

The alicyclic epoxy resin (produced by DAICEL Co., Celloxide 2021) and the polymer powder were formulated at the ratios as shown in table 5, and were blended for 3 minutes in the planetary vacuum blender (manufactured by Thinky Co., trade name "ARV-310LED") at a rotation rate of 1200 rpm at atmospheric pressure, to obtain the blend. The resulted blends were treated once at roller spacing of 20 μm/10 μm, once at roller spacing of 10 μm/5 μm, and once at roller spacing of 5

μm/5 μm in the three-roll mill (manufactured by EXAKT Co., "M-80E") at a rotation rate of 200 rpm.

Thereafter, the planetary vacuum blender (manufactured by Thinky Co., trade name "ARV-310LED") was used again for blending/debubbling over 2 minutes at a rotation rate of 1200 rpm at a reduced pressure of 3 KPa, to obtain the epoxy resin composition.

The resulted epoxy resin composition was assessed for its dispersity, gelling temperature and gelling performance. Assessment results were given in table 5.

Embodiment 51 to Embodiment 60, Comparative Example 36 to Comparative Example 38

In the resulted epoxy resin composition, the anhydride-based curing agent (trade name "Rikacid MH-700", produced by New Japan Chemical Co., Ltd.) and tetrabutyl phosphonium diethyl phosphorodithioate as curing accelerant (produced by Nippon Chemical Industrial Co., "Hisilicon PX-4ET") were formulated at the ratios as shown in table 6, and were blended/debubbled for 2 minutes in the planetary vacuum blender (manufactured by Thinky Co., trade name "ARV-310LED") at a rotation rate of 1200 rpm at a reduced pressure of 3 KPa, to obtain the epoxy resin composition.

Subsequently, a PET film (produced by Toyobo Co., trade name: TN200) was applied on single side of each of the 2 reinforced glass boards of length 300 mm×width 300 mm×thickness 5 mm, with the PET films facing in opposite direction; and the spacer made from Teflon (registered trademark) with a thickness of 3 mm was sandwiched between the reinforced glass boards to obtain the mold. The epoxy resin composition was filled in the mold, fixed by a clamp and then precured for 3 hours at 100° C. prior to curing for 4 hours at 120° C., and was taken out of the mold to obtain the cured material with a thickness of 3 mm. The results from assessment of appearance, total light transmittance, glass transition temperature and relative dielectric constant of the resulted epoxy resin cured material were given in table 6.

TABLE 5

| | | | Embodiment 41 | Embodiment 42 | Embodiment 43 | Embodiment 44 | Embodiment 45 | Embodiment 46 | Embodiment 47 | Embodiment 48 | Embodiment 49 | Embodiment 50 | Comparative example 33 | Comparative example 34 | Comparative example 35 |
|---|---|---|---|---|---|---|---|---|---|---|---|---|---|---|---|
| Formulation (parts) | Vinyl polymer powder (A) | P2-1 | 20 | | | | | | | | | | | | |
| | | P2-2 | | 20 | | | | | | | | | | | |
| | | P2-3 | | | 20 | | | | | | | | | | |
| | | P2-4 | | | | 20 | | | | | | | | | |
| | | P2-5 | | | | | 20 | | | | | | | | |
| | | P2-6 | | | | | | 20 | | | | | | | |
| | | P2-7 | | | | | | | 20 | | | | | | |
| | | P2-8 | | | | | | | | 20 | | | | | |
| | | P2-9 | | | | | | | | | 20 | | | | |
| | | P2-10 | | | | | | | | | | 20 | | | |
| | | P2'-1 | | | | | | | | | | | 20 | | |
| | | P2'-2 | | | | | | | | | | | | 20 | |
| | Epoxy resin (B) | Celloxide 2021 | 100 | 100 | 100 | 100 | 100 | 100 | 100 | 100 | 100 | 100 | 100 | 100 | 100 |
| Assessment of epoxy resin composition | Dispersity | | ○ | ○ | ○ | ○ | ○ | ○ | ○ | ○ | ○ | ○ | ○ | Δ | — |
| | Assessment of gelling property | Gelling temperature (° C.) | 80 | 84 | 90 | 92 | 89 | 81 | 78 | 75 | 74 | 72 | 85 | No gelling | No gelling |
| | | Gelling performance | ○ | ○ | ○ | ○ | ○ | ○ | ○ | ○ | ○ | ○ | ○ | — | — |

TABLE 6

| | | | Embodiment 51 | Embodiment 52 | Embodiment 53 | Embodiment 54 | Embodiment 55 | Embodiment 56 | Embodiment 57 |
|---|---|---|---|---|---|---|---|---|---|
| Formulation (parts) | Vinyl polymer (A) | Type | P2-1 | P2-2 | P2-3 | P2-4 | P2-5 | P2-6 | P2-7 |
| | | Dose | 20 | 20 | 20 | 20 | 20 | 20 | 20 |
| | Epoxy resin (B) | Celloxide 2021 | 100 | 100 | 100 | 100 | 100 | 100 | 100 |
| | Curing agent | MH-700 | 117 | 117 | 117 | 117 | 117 | 117 | 117 |
| | Curing-accelerant | PX-4ET | 1 | 1 | 1 | 1 | 1 | 1 | 1 |
| Assessment of the epoxy resin cured material | Appearance | | ○ | ○ | ○ | ○ | ○ | ○ | ○ |
| | Total light transmittance (%) | 23° C. | 73.5 | 87.9 | 90.6 | 90.9 | 85.6 | 88.4 | 88.7 |
| | | Judgement | Δ | ○ | ○ | ○ | ○ | ○ | ○ |
| | | 120° C. | 53.5 | 87.3 | 90.4 | 90.7 | 83.0 | 86.3 | 86.9 |
| | | Judgement | Δ | ○ | ○ | ○ | ○ | ○ | ○ |
| | Glass transition temperature [° C.] | | 224 | 225 | 225 | 227 | 226 | 224 | 220 |
| | Relative dielectric constant | | 3.23 | 3.24 | 3.22 | 3.23 | 3.24 | 3.23 | 3.23 |
| | | | ○ | ○ | ○ | ○ | ○ | ○ | ○ |

TABLE 6-continued

|  |  |  | Embodiment 58 | Embodiment 59 | Embodiment 60 | Comparative example 36 | Comparative example 37 | Comparative example 38 |
|---|---|---|---|---|---|---|---|---|
| Formulation (parts) | Vinyl polymer (A) | Type | P2-8 | P2-9 | P2-10 | P2'-1 | P2'-2 | — |
|  |  | Dose | 20 | 20 | 20 | 20 | 20 | — |
|  | Epoxy resin (B) | Celloxide 2021 | 100 | 100 | 100 | 100 | 100 | 100 |
|  | Curing agent | MH-700 | 117 | 117 | 117 | 117 | 117 | 117 |
|  | Curing-accelerant | PX-4ET | 1 | 1 | 1 | 1 | 1 | 1 |
| Assessment of the epoxy resin cured material | Appearance |  | ○ | ○ | ○ | ○ | Δ | ○ |
|  | Total light transmittance (%) | 23° C. | 90.9 | 91.0 | 91.1 | 90.8 | 91.5 | 92.3 |
|  |  | Judgement | ○ | ○ | ○ | ○ | ○ | ○ |
|  |  | 120° C. | 65.9 | 90.7 | 91.1 | 90.7 | 91.0 | 92.2 |
|  |  | Judgement | Δ | ○ | ○ | ○ | ○ | ○ |
|  | Glass transition temperature [° C.] |  | 224 | 223 | 223 | 210 | 218 | 229 |
|  | Relative dielectric constant |  | 3.23 | 3.22 | 3.24 | 3.26 | 3.60 | 3.23 |
|  |  |  | ○ | ○ | ○ | ○ | X | ○ |

Embodiment 61, Embodiment 62, and Comparative Example 39 to Comparative Example 41

The bisphenol A-based hydrogenated alicyclic epoxy resin (produced by Mitsubishi Chemical Co, "YX-8000") and the polymer powder were formulated at the ratios as shown in table 7, and the epoxy resin composition was provided in the same manner as in Embodiment 41. The resulted epoxy resin composition was assessed for its dispersity, gelling temperature and gelling performance. The results from assessment were given in table 7.

Embodiment 63, Embodiment 64, and Comparative Example 42 to Comparative Example 44

In the resulted epoxy resin composition, the anhydride-based curing agent (trade name "Rikacid MH-700", produced by New Japan Chemical Co., Ltd.) and tetrabutyl phosphonium diethyl phosphorodithioate as curing accelerant (produced by Nippon Chemical Industrial Co., "Hisilicon PX-4ET") were formulated at the ratios as shown in table 8, and the epoxy resin composition cured material was obtained in the same manner as in Embodiment 51. The results from assessment of appearance, total light transmittance, glass transition temperature and relative dielectric constant of the resulted epoxy resin cured material were given in table 8.

TABLE 7

|  |  |  | Embodiment 61 | Embodiment 62 | Comparative example 39 | Comparative example 40 | Comparative example 41 |
|---|---|---|---|---|---|---|---|
| Formulation (parts) | Vinyl polymer (A) | P2-1 | 20 |  |  |  |  |
|  |  | P2-2 |  | 20 |  |  |  |
|  |  | P2'-1 |  |  | 20 |  |  |
|  |  | P2'-2 |  |  |  | 20 |  |
|  | Epoxy resin (B) | YX-8000 | 100 | 100 | 100 | 100 | 100 |
| Assessment of epoxy resin composition | Dispersity |  | ○ | ○ | ○ | Δ | — |
|  | Assessment of gelling property | Gelling temperature (° C.) | 90 | 96 | 102 | No gelling | No gelling |
|  |  | Gelling performance | ○ | ○ | ○ | — | — |

TABLE 8

|  |  |  | Embodiment 63 | Embodiment 64 | Comparative example 42 | Comparative example 43 | Comparative example 44 |
|---|---|---|---|---|---|---|---|
| Formulation (parts) | Vinyl polymer (A) | Type | P2-1 | P2-2 | P2'-1 | P2'-2 | — |
|  |  | Dose | 20 | 20 | 20 | 20 | — |
|  | Epoxy resin (B) | YX-8000 | 100 | 100 | 100 | 100 | 100 |
|  | Accelerant | MH-700 | 80 | 80 | 80 | 80 | 80 |
|  | Curing accelerant | PX-4ET | 1 | 1 | 1 | 1 | 1 |
| Assessment of the epoxy resin cured | Appearance |  | ○ | ○ | ○ | Δ | ○ |
|  | Total light transmittance (%) | 23° C. | 83.4 | 91.6 | 93.0 | 92.6 | 93.3 |
|  |  | Judgement | ○ | ○ | ○ | ○ | ○ |

TABLE 8-continued

|  |  | Embodiment 63 | Embodiment 64 | Comparative example 42 | Comparative example 43 | Comparative example 44 |
|---|---|---|---|---|---|---|
| material | Glass transition temperature (° C.) | 132 | 134 | 108 | 115 | 128 |
|  | Relative dielectric constant | 2.92 ◯ | 2.85 ◯ | 2.89 ◯ | 3.36 X | 2.91 ◯ |

As shown in table 5 to table 8, the epoxy resin compositions added with the polymer powder (P2-1) to the polymer powder (P2-10) of the present invention have excellent dispersity and high gelling properties. In addition, the epoxy resin cured material obtained by curing the epoxy resin compositions added with the polymer powder (P2-1) to the polymer powder (P2-10) have excellent appearance and high transparency.

Especially for the epoxy resin cured material added with the carboxyl group-containing polymer powder (P2-2, P2-3, P2-4, P2-9) and the hydroxyl group-containing polymer powder (P2-5, P2-6, P2-7, P2-10), it has high transparency (Embodiment 52 to Embodiment 57, Embodiment 59, Embodiment 60, Embodiment 64). Furthermore, it also has less transparency lowering, even at hot conditions (Embodiment 52 to Embodiment 57, Embodiment 59, Embodiment 60). Therefore, it may also be used in applications such as sealing materials for optical semiconductors requiring high transparency and transparency at hot conditions.

The epoxy resin cured materials added with the polymer powder (P2-8) to the polymer powder (P2-10) having the refractivity of 1.50 have high transparency (Embodiment 58 to Embodiment 60), due to the low difference between refractivities of the epoxy resin cured material and the vinyl polymer. Furthermore, through the introduction of carboxyl and hydroxy, high transparency may also be maintained, even at hot conditions (Embodiment 59, Embodiment 60).

In addition, the epoxy resin cured material added with the polymer powder (P2-1) to the polymer powder (P2-10) of the present invention may also be used in applications requiring high heat resistance, due to low reduction of the glass transition temperature. Moreover, it also is applied in the field of electronic materials due to low relative dielectric constant.

The cured materials added with the polymer powder (P2'-1) having the acetone-soluble component out of the range of the present invention have a substantially lowered glass transition temperature, due to more acetone-soluble component, when compared to the cured material added with the polymer powder (P2) of the present invention. (Comparative example 36, Comparative example 42)

No gelling was not found in the epoxy resin compositions added with the polymer powder (P2'-2) having the acetone-soluble component and molecular weight of the acetone-soluble component out of the range of the present invention. (Comparative example 34, Comparative example 40)

In addition, due to more alkali metal ions in the polymer powder (P2'-2), the epoxy resin cured materials added with the polymer powder (P2'-2) have low electric properties (Comparative example 37). Moreover, due to low glass transition temperature of the polymer powder (P2'-2), the epoxy resin cured materials added with the polymer powder (P2'-2) have a lowered glass transition temperature (Comparative example 37, Comparative example 43).

No gelling was found in the epoxy resin composition without addition of vinyl polymer, in Comparative example 35 and Comparative example 41.

INDUSTRIAL APPLICABILITY

By heating for short time at a given temperature, due to excellent dispersity in the curable resins, especially in the epoxy resins, the polymer powder according to the present invention enables the curable resin composition to rapidly turn into the gel state, resulting in low elastic modulus for the cured material, and therefore may be used as both the stress relaxation agent and the pre-gelling agent for electronic materials.

Especially for the curable resin composition added with the polymer powder according to the present invention, due to excellence in equilibrium of initial viscosity, gelling property and elastic modulus-lowering effect of the cured material, it may be used for various uses as bellows: liquid sealing materials such as primary-mounting under-filling materials, secondary-mounting under-filling materials, and grab-top materials in wire bonding; sealing sheets for collectively sealing various chips on the substrate; predispensing type under-filling materials; sealing sheets for collective sealing on a wafer level, bonding layers for three-ply copper foil laminates; bonding layers such as die bonding films, die attaching films, interlayer insulation films, cover lay films; bonding pastes such as die bonding pastes, interlayer insulation pastes, conductive pastes, anisotropic conductive pastes; sealing materials for light-emitting diodes; optical adhesive agents; and sealing materials for various flat-panel displays such as liquid crystal and organic EL.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalences.

What is claimed is:

1. A polymer powder (P2), having a volume average primary particle size (Dv) of 200 nm or more and comprising an acetone-soluble component of 2 mass % or more and less than 30 mass %, the acetone-soluble component having a mass average molecular weight of 100,000 or more.

2. The polymer powder (P2) according to claim 1, wherein the polymer powder (P2) has a refractivity of 1.48 to 1.51 at 20° C.

3. The polymer powder (P2) according to claim 1, wherein the polymer powder (P2) is a methyl methacrylate-based polymer powder obtained by polymerizing a monomer raw material (a2) comprising 70 mass % to 99 mass % of methyl methacrylate and 30 mass % to 1 mass % of a monomer raw material other than methyl methacrylate to provide a vinyl polymer which is subsequently powderized.

4. The polymer powder (P2) according to claim 1 in particle form with particle sizes of 10 μm or less comprising a proportion of less than 30 vol % and having the following disintegration properties:
   (1) diluting the polymer powder (P2) with ion exchanged water;
   (2) performing supersonic irradiation at a frequency of 42 kHz and a power of 40 W for 3 minutes;

(3) determining particle size distribution through particle size distribution measurement by laser diffractive/scattering; and (4) the particles with the particle sizes of 10 μm or less take a proportion of 30 vol % or more.

5. A pre-gelling agent for a curable resin, comprising the polymer powder (P2) according to claim 1.

6. The pre-gelling agent for a curable resin according to claim 5, providing the curable resin with a gelling property such that a ratio (G'B/G'A) of storage elastic modulus G'A at a gelling temperature of −20° C. to storage elastic modulus G'B at a gelling temperature of +20° C. for the curable resin composition is 100 or more, wherein the curable resin composition is prepared by adding 20 parts by mass of the polymer powder (P2) relative to 100 parts by mass of the curable resin.

7. A curable resin composition, comprising the polymer powder (P2) according to claim 1 and a curable resin.

8. The curable resin composition according to claim 7, wherein the curable resin is an epoxy resin.

9. The curable resin composition according to claim 8, wherein the epoxy resin is an alicyclic epoxy resin.

10. The curable resin composition according to claim 7, wherein a cured material with a thickness of 3 mm, obtained by curing the curable resin composition comprising the polymer powder (P2) and the curable resin, has a total light transmittance of 70% or more at 23° C.

11. A cured material, obtained by curing the curable resin composition according to claim 7.

12. A sealing material for optical semiconductors, comprising the curable resin composition according to claim 7.

* * * * *